(12) United States Patent
Lee

(10) Patent No.: US 10,199,878 B2
(45) Date of Patent: Feb. 5, 2019

(54) WIRELESS POWER TRANSCEIVER AND WIRELESS POWER TRANSCEIVING SYSTEM INCLUDING THE SAME

(71) Applicant: SAMSUNG ELECTRONICS CO., LTD., Suwon-si, Gyeonggi-do (KR)

(72) Inventor: Sang-Hyo Lee, Incheon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 408 days.

(21) Appl. No.: 15/017,807

(22) Filed: Feb. 8, 2016

(65) Prior Publication Data
US 2016/0365753 A1    Dec. 15, 2016

(30) Foreign Application Priority Data
Jun. 10, 2015    (KR) ........................ 10-2015-0081760

(51) Int. Cl.
*H02J 50/20* (2016.01)
*H02J 7/02* (2016.01)
*H02M 3/335* (2006.01)
*H03H 7/38* (2006.01)
*H04B 5/00* (2006.01)
*H02J 50/50* (2016.01)
*G06F 1/26* (2006.01)
(Continued)

(52) U.S. Cl.
CPC ............. *H02J 50/20* (2016.02); *G06F 1/26* (2013.01); *H02J 7/025* (2013.01); *H02J 7/045* (2013.01); *H02J 50/50* (2016.02); *H02M 3/33584* (2013.01); *H03H 7/38* (2013.01); *H04B 5/0037* (2013.01); *H02M 1/32* (2013.01); *H02M 2001/0058* (2013.01); *H02M 2007/4818* (2013.01); *H03K 2017/9602* (2013.01);
(Continued)

(58) Field of Classification Search
CPC ................. H02M 3/33584; H02M 2001/0058
See application file for complete search history.

(56) References Cited

U.S. PATENT DOCUMENTS 8,228,025 B2   7/2012  Ho et al.
8,278,784 B2   10/2012 Cook et al.
(Continued)

FOREIGN PATENT DOCUMENTS

KR       10-1428360         8/2014
WO    WO 2013/002488 A1     1/2013
WO    WO 2014039088 A1 *    3/2014  .............. H02J 5/005

*Primary Examiner* — Thienvu Tran
*Assistant Examiner* — Pinping Sun
(74) *Attorney, Agent, or Firm* — Volentine, Whitt & Francos, PLLC

(57) ABSTRACT

A wireless power transceiver includes input generator, inverter, battery, antenna, impedance matching circuit, and mode voltage changer. The input generator outputs an input voltage as a primary input voltage and a secondary input voltage in a power transmitting mode. The input generator outputs a power supply voltage as a primary input voltage and outputs a ground voltage as a secondary input voltage in a power receiving mode. The inverter outputs to the second node, an inverted version of the input voltage in the power transmitting mode, and outputs to the first node, a rectified voltage of the second node in power receiving mode. The impedance matching circuit is connected between the second node and the antenna. The mode voltage changer converts a battery voltage of the battery to output the power supply voltage in the power transmitting mode, and charges the battery with a voltage converted from the power supply voltage in the power receiving mode.

16 Claims, 18 Drawing Sheets

(51) Int. Cl.
*H02J 7/04* (2006.01)
*H02M 1/32* (2007.01)
*H02M 1/00* (2006.01)
*H02M 7/48* (2007.01)
*H03K 17/96* (2006.01)

(52) U.S. Cl.
CPC .......... *Y02B 40/90* (2013.01); *Y02B 70/1441* (2013.01); *Y02B 70/1491* (2013.01)

(56) References Cited

U.S. PATENT DOCUMENTS

| | | | |
|---|---|---|---|
| 8,487,481 B2 | 7/2013 | Cook et al. | |
| 8,643,326 B2 | 2/2014 | Campanella et al. | |
| 8,716,899 B2 | 5/2014 | Yi et al. | |
| 8,796,885 B2 | 8/2014 | Tan et al. | |
| 8,818,267 B2 | 8/2014 | Savoj | |
| 8,829,724 B2 | 9/2014 | Ryu et al. | |
| 2010/0148723 A1 | 6/2010 | Cook et al. | |
| 2011/0018494 A1 | 1/2011 | Mita | |
| 2011/0254377 A1* | 10/2011 | Wildmer | B60L 11/182 307/104 |
| 2012/0056487 A1 | 3/2012 | Choi et al. | |
| 2012/0077551 A1* | 3/2012 | Balteanu | G05F 1/56 455/572 |
| 2013/0026981 A1 | 1/2013 | Van Der Lee | |
| 2014/0152249 A1* | 6/2014 | Yeh | H02J 50/10 320/108 |
| 2014/0159646 A1 | 6/2014 | Sankar et al. | |
| 2016/0001662 A1* | 1/2016 | Miller | B60L 11/005 307/104 |

\* cited by examiner

WIRELESS POWER TRANSCEIVER AND WIRELESS POWER TRANSCEIVING SYSTEM INCLUDING THE SAME

CROSS-REFERENCE TO RELATED APPLICATION

A claim of priority under 35 USC § 119 is made to Korean Patent Application No. 10-2015-0081760, filed on Jun. 10, 2015, in the Korean Intellectual Property Office (KIPO), the disclosure of which is incorporated by reference in its entirety herein.

BACKGROUND

Example embodiments relate generally to wireless power transceivers, and more particularly to wireless power transceivers that may be implemented in a small area.

A conventional wireless power transceiving system includes a wireless power transmitter and a wireless power receiver. Because a wireless power receiver (e.g. smartphone) including a power transmitting function may be a charging system of a small mobile device such as a wearable device or a bluetooth headset, research to merge the wireless power transmitter and the wireless power receiver has proceeded.

SUMMARY

According to example embodiments, a wireless power transceiver includes an input generator, an inverter, a battery, an antenna, an impedance matching circuit, and a mode voltage changer. The input generator is connected to a first node and a ground voltage. The input generator receives a mode signal indicating a power transmitting mode or a power receiving mode, and outputs an input voltage as a primary input voltage and a secondary input voltage in the power transmitting mode. The input generator outputs a power supply voltage of the first node as the primary input voltage and outputs the ground voltage as the secondary input voltage in the power receiving mode. The inverter output to a second node, an inverted version of the input voltage in the power transmitting mode and outputs to the first node, a rectified voltage of a voltage of the second node in the power receiving mode. The impedance matching circuit is connected between the second node and the antenna. The mode voltage changer converts a battery voltage of the battery to output the power supply voltage in the power transmitting mode, and charges the battery with a voltage converted from the power supply voltage in the power receiving mode.

In example embodiments, the inverter may output the input voltage to the second node in the power transmitting mode, and a level of a voltage induced at the antenna may be proportional to an intensity of a signal received at the antenna in the power receiving mode.

In example embodiments, the inverter may include a p-channel metal-oxide semiconductor (PMOS) transistor and an n-channel metal-oxide semiconductor (NMOS) transistor. The PMOS transistor may have a gate receiving the primary input voltage, a drain and a body connected to the first node, and a source connected to the second node. The PMOS transistor may operate as a first diode that outputs the rectified voltage as the power supply voltage in the power receiving mode. The NMOS transistor may include a gate receiving the secondary input voltage, a drain connected to the second node, and a source and a body connected to the ground voltage. The impedance matching circuit may perform an impedance matching operation between the second node and the antenna such that a maximum power is delivered to the antenna in the power transmitting mode. The impedance matching circuit may convert the voltage induced at the antenna to the voltage of the second node in the power receiving mode.

In the power receiving mode, the PMOS transistor may operate as the first diode that is forward-biased between the second node and the first node and the NMOS transistor may operate as a second diode that is reverse-biased between the second node and the ground voltage.

In example embodiments, the input generator may include first and second PMOS transistors and first and second NMOS transistors. The first PMOS transistor may have a source receiving the input voltage, a gate receiving the mode signal, and a drain connected to a third node. The first NMOS transistor may have a drain receiving the power supply voltage, a gate receiving the mode signal, a source connected to the third node and a voltage of the third node may be the primary input voltage. The second PMOS transistor may have a source receiving the input voltage, a gate receiving the mode signal, and a source connected to a fourth node. The second NMOS transistor may have a drain connected to the ground voltage, a gate receiving the mode signal, a source connected to the fourth node and a voltage of the fourth node may be the secondary input voltage.

In example embodiments, the mode changer may include a first DC-DC converter, a second DC-DC converter, a PMOS transistor, an NMOS transistor and a charger. The battery voltage may be applied to a third node. The NMOS transistor may have a source connected to the charger, a gate receiving the mode signal, and a drain connected to the third node. The PMOS transistor may have a source connected to the first DC-DC converter, a gate receiving the mode signal, and a drain connected to the third node. The charger may be connected between the second DC-DC converter and the NMOS transistor. The first DC-DC converter may be connected between the first node and the PMOS transistor. The second DC-DC converter may be connected between the first node and the charger.

When the mode signal has a first logic level to designate the power transmitting mode, the first DC-DC converter may generate the power supply voltage at the first node by converting the battery voltage at the third node. When the mode signal has a second logic level to designate the power receiving mode, the second DC-DC converter may generate a charging voltage by converting the power supply voltage at the first node, and the charger may charge the battery based on the charging voltage.

In example embodiments, the mode voltage changer may include a DC-DC converter, a charger, a PMOS transistor, an NMOS transistor and an over-voltage protector. The battery voltage may be applied to a third node. The NMOS transistor may have a source connected to a fourth node, a gate receiving the mode signal, and a drain connected to the third node. The PMOS transistor may have a drain connected to a fifth node, a gate receiving the mode signal, and a source connected to the third node. The DC-DC converter may be connected between the first node and the fifth node. The charger may be connected between the first node and a fourth node. The over-voltage protector may be connected between the first node and the ground voltage.

When the mode signal has first logic level to designate the power transmitting mode, the DC-DC converter may generate the power supply voltage at the first node by converting the battery voltage of the fifth node. When the mode signal has a second logic level to designate the power receiving mode, the charger may charge the battery based on the power supply voltage of the first node, and the over-voltage protector may maintain the power supply voltage of the first node so as not to exceed a predetermined voltage level.

In an example embodiment, the mode voltage changer may include a reverse-voltage preventing DC-DC converter, a charger, and an over-voltage protector. The battery voltage may be applied to a third node. The reverse-voltage preventing DC-DC converter may be connected between the first node and the third node. The charger may be connected in parallel with the reverse-voltage preventing DC-DC converter between the first node and the third node. The over-voltage protector may be connected between the first node and the ground voltage. When the mode signal has a second logic level to designate the power receiving mode, the charger may charge the battery based on the power supply voltage, and the over-voltage protector may maintain the power supply voltage of the first node so as not to exceed a predetermined voltage level.

The reverse-voltage preventing DC-DC converter may electrically disconnect the first node and the third node when the power supply voltage of the first node is larger than the battery voltage of the third node.

The reverse-voltage preventing DC-DC converter may include a DC-DC converter and a diode. The DC-DC converter may be connected between the first node and the diode, and the diode may be connected between the DC-DC converter and the third node.

The power supply voltage may be maintained to be lower than the predetermined voltage level in the power transmitting mode.

In example embodiments, the impedance matching circuit may generate the voltage of the antenna by filtering a high frequency component of the voltage of the second node.

In example embodiments, when the input voltage has a frequency of 13.65 MHz, the wireless power transceiver may operate as a near field communication (NFC) transceiver.

According to example embodiments, a wireless power transceiver includes a first input generator, a second input generator, a first inverter, a second inverter, a battery, an antenna, an impedance matching circuit and a mode voltage changer. The first input generator is connected to a first node and a ground voltage. The first input generator receives a mode signal indicating a power transmitting mode or a power receiving mode, outputs an input voltage as a first primary input voltage and a first secondary input voltage in the power transmitting mode, and outputs a power supply voltage of the first node as the first primary input voltage and outputs the ground voltage as the first secondary input voltage in the power receiving mode. The second input generator is connected to the first node and the ground voltage. The second input generator receives the mode signal, outputs an inverted version of the input voltage as a second primary input voltage and a second secondary input voltage in the power transmitting mode, and outputs the power supply voltage as the second primary input voltage and outputs the ground voltage as the second secondary input voltage in the power receiving mode. The first inverter outputs to a second node, the inverted version of the input voltage in the power transmitting mode, and outputs to the first node, a first rectified voltage of a voltage of the second node in the power receiving mode. The second inverter outputs the input voltage to a third node in the power transmitting mode, and outputs to the first node, a second rectified voltage of a voltage of the third node in the power receiving mode. The impedance matching circuit is connected between the second node, the third node and the antenna. The mode voltage changer converts a battery voltage of the battery to output the power supply voltage in the power transmitting mode, and charges the battery with a voltage converted from the power supply voltage in the power receiving mode.

In example embodiments, the first inverter may include a first PMOS transistor and a first NMOS transistor and the second inverter may include a second PMOS transistor and a second NMOS transistor. The first PMOS transistor may have a gate receiving the first primary input voltage, a drain connected to the second node, and a source and a body connected to the first node. The PMOS transistor may operate as a first diode to output the first rectified voltage as the power supply voltage in the power receiving mode. The first NMOS transistor may have a gate receiving the first secondary input voltage, a drain connected to the second node, and a source and a body connected to the ground voltage. The second PMOS transistor may have a gate receiving the second primary input voltage, a drain connected to the third node, and a source and a body connected to the first node. The second PMOS transistor may operate as a second diode to output the second rectified voltage as the power supply voltage in the power receiving mode. The second NMOS transistor may have a gate receiving the second secondary input voltage, a drain connected to the third node, and a source and a body connected to the ground voltage. The impedance matching circuit may perform an impedance matching operation between the second node, the third node and the antenna such that a maximum power is delivered to the antenna in the power transmitting mode. The impedance matching circuit may convert a voltage at the antenna to a voltage between the second node and the third node in the power receiving mode.

According to example embodiments, a wireless power transceiving system includes a wireless power transmitter, a wireless power receiver, and a wireless power transceiver. The wireless power transceiver includes a battery, an inverter and an input/output (I/O) circuit. The inverter generates a first voltage signal corresponding to an input voltage based on a battery voltage of the battery in a power transmitting mode, and charges the battery with a rectified voltage of a second voltage signal in a power receiving mode. The I/O circuit generates a first wireless power signal corresponding to the first voltage signal and transmits the first wireless power signal to the wireless power receiver in the power transmitting mode. The I/O circuit generates the second voltage signal corresponding to a second wireless power signal received from the wireless power transmitter in the power receiving mode.

In example embodiments, the wireless power transceiver may further include an input generator and a mode voltage changer. The I/O circuit may include an impedance matching circuit and an antenna. The input generator may output the input voltage as a primary input voltage and a secondary input voltage in the power transmitting mode, and may output a power supply voltage of a first node, as the primary input voltage and may output a ground voltage as the secondary input voltage in the power receiving mode. The inverter may output to a second node, the first voltage signal by inverting the input voltage in the power transmitting mode, and may output to the first node, a rectified voltage of the second voltage signal of the second node in the power receiving mode. The impedance matching circuit may be connected between the second node and the antenna. The antenna may transmit the first wireless power signal to the wireless power receiver in the power transmitting mode, and may receive the second wireless power signal from the wireless power transmitter. The mode voltage changer may convert the battery voltage to output the power supply voltage in the power transmitting mode, and may charge the battery with a voltage converted from the power supply voltage in the power receiving mode.

As described above, the wireless power transceiver according to example embodiments may charge the battery during receiving wireless power by using a class-D inverter as a rectifier by controlling gate input of transistors included in the class-D inverter used for wireless power transmission and may reduce occupied area.

BRIEF DESCRIPTION OF THE DRAWINGS

Example embodiments of the inventive concept will be more clearly understood from the following detailed description taken in conjunction with the accompanying drawings.

DETAILED DESCRIPTION OF THE EMBODIMENTS

Figure 1:
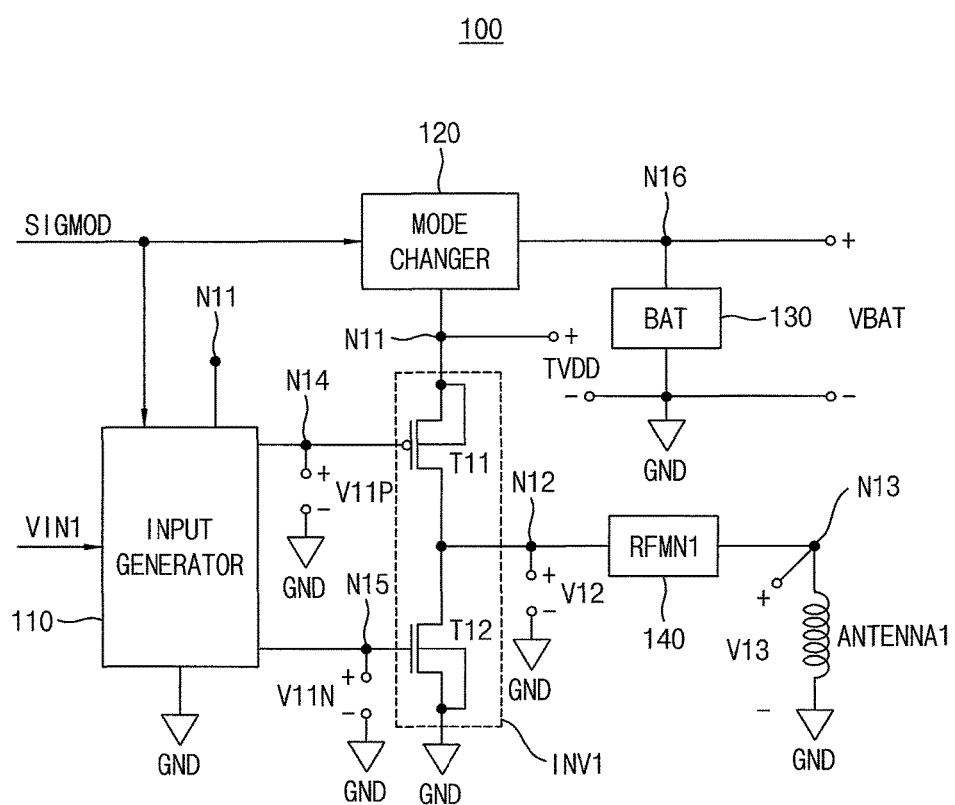
FIG. 1 is a block diagram illustrating a wireless power transceiver according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

In the present inventive concepts, the terms, a primary input voltage and a secondary input voltage, may be construed as a logical high voltage and a logical low voltage, or a power supply voltage and a ground voltage so as to turn on or turn off a CMOS transistor, wherein each of the primary input voltage and the secondary voltage is applied to a gate of the transistor.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a wireless power transceiver according to example embodiments.

Referring to FIG. 1, a wireless power transceiver 100 includes an input generator 110, an inverter INV1, a battery 130, an antenna ANTENNA1, an impedance matching circuit 140, and a mode voltage changer 120.

The input generator 110 receives a mode signal SIGMODE designating one of a power transmitting mode and a power receiving mode, and is connected between a first node V11 and a ground voltage GND. The input generator 110 outputs an input voltage VIN1 as a primary input voltage V11P and a secondary input voltage V11N in the power transmitting mode. The mode signal SIGMOD has a first logic level to designate the power transmitting mode. The input generator 110 outputs a power supply voltage TVDD, which is a voltage of the first node N11, as the primary input voltage V11P, and outputs the ground voltage GND as the secondary input voltage V11N in the power receiving mode. The mode signal SIGMOD has a second logic level to designate the power receiving mode. Structure and operation of the input generator 110 will be described later with reference to FIG. 2.

The inverter INV1 outputs to a second node N12, an inverted version of the input voltage VIN1 in the power transmitting mode. The inverter INV1 outputs to the first node N11, a rectified voltage of a voltage V12 of the second node N12 in the power receiving mode. The inverter INV1 may include a p-channel metal-oxide semiconductor (PMOS) transistor T11 and an n-channel metal-oxide semiconductor (NMOS) transistor T12. The PMOS transistor T11 may have a gate receiving the primary input voltage V11P, a source and a body which are connected to the first node N11, and a drain connected to the second node N12. The PMOS transistor T11 may operate as a first diode and output, to the first node N11, the rectified voltage of the voltage V12 of the second node N12 as the power supply voltage TVDD in the power receiving mode. The NMOS transistor T12 may have a gate receiving the secondary input voltage V11N, a drain connected to the second node N12, and a source and a body connected to the ground voltage GND.

The first PMOS transistor T11 and the first NMOS transistor T12 operate as a class-D inverter which generates the voltage V12 of the second node N12 based on the input voltage VIN1 in the power transmitting mode.

The impedance matching circuit 140 is connected between the second node N12 and a third node N13 connected to the antenna ANTENNA1. The impedance matching circuit 140 may perform an impedance matching operation between the second node N12 and the antenna ANTENNA1 by converting the voltage V12 to a voltage V13 induced in the antenna ANTENNA1 such that a maximum power is delivered to the antenna ANTENNA1 in the power transmitting mode, and the impedance matching circuit 140 may convert the voltage V13 to the voltage V12 in the power receiving mode. Embodiments of the impedance matching circuit 140 will be described later with references to FIGS. 12 and 13.

The mode voltage changer 120 outputs converts a battery voltage VBAT of the battery 130 to output the power supply voltage TVDD in the power transmitting mode. The mode voltage changer 120 charges the battery 130 with a voltage converted from the power supply voltage TVDD in the power receiving mode. Structure and operation of the mode voltage changer 120 will be described later with references to FIGS. 3 through 11.

The inverter INV1 outputs the input voltage VIN1 as the voltage V12 of the second node N12 in the power transmitting mode, and the voltage V13 induced in the antenna ANTENNA1 may have a level proportional to an intensity of received signal at the antenna ANTENNA1 in the power receiving mode. In example embodiments, when the input voltage VIN1 has a frequency of 13.65 MHz, the wireless power transceiver 100 may operate as near field communication (NFC) transceiver.

Figure 2:
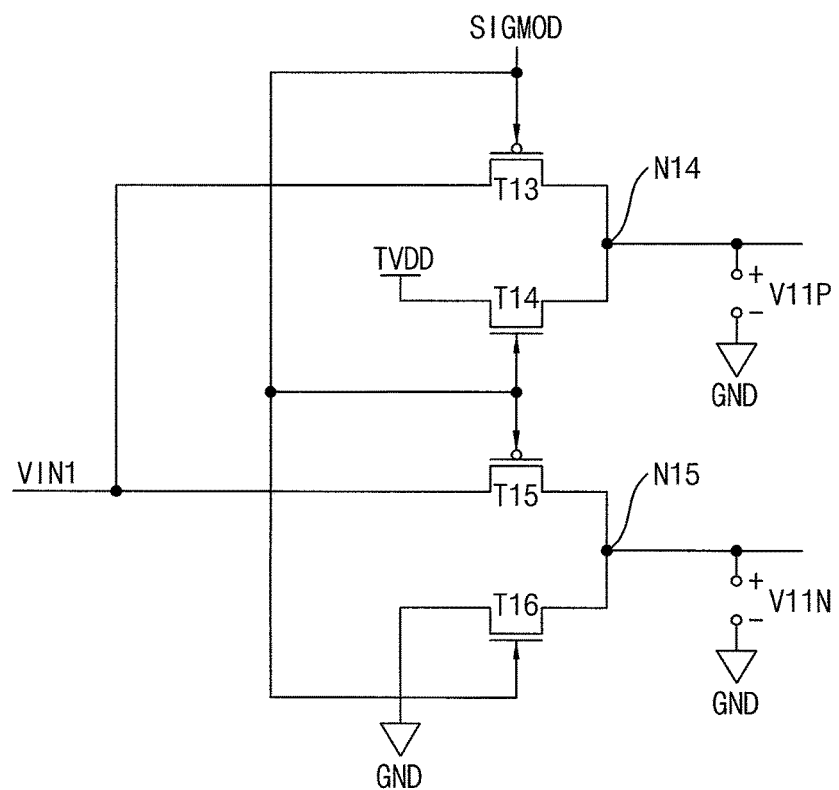
FIG. 2 is a circuit diagram illustrating an example of the input generator in the wireless power transceiver of FIG. 1 according to example embodiments.

FIG. 2 is a circuit diagram illustrating an example of the input generator in the wireless power transceiver of FIG. 1 according to example embodiments.

Referring to FIG. 2, the input generator 110 may include PMOS transistors T13 and T15 and NMOS transistors T14 and T16.

The PMOS transistor T13 may have a source receiving the input voltage VIN1, a gate receiving the mode signal SIGMOD, and a drain connected to a fourth node N14. The NMOS transistor T14 may have a drain connected to the power supply voltage TVDD, a gate receiving the mode signal SIGMOD, and a source connected to the fourth node N14. A voltage of the fourth node N14 may be the primary input voltage V11P. The PMOS transistor T15 may have a source receiving the input voltage VIN1, a gate receiving the mode signal SIGMOD, and a drain connected to a fifth node N15. The NMOS transistor T16 may have a source connected to the ground voltage GND, a gate receiving the mode signal SIGMOD, and a drain connected to the fifth node N15. A voltage of the fifth node N15 may be the secondary input voltage V11N.

When the mode signal SIGMODE has a first logic level (logic low level) to designate the power transmitting mode, the PMOS transistor T13 and the PMOS transistor T15 are turned on, the NMOS transistor T14 and the NMOS transistor T16 are turned off, and the input voltage VIN1 is provided as the primary input voltage V11P and the secondary input voltage V11N.

When the mode signal SIGMOD has a second logic level (logic high level) to designate the power receiving mode, the second PMOS transistor T13 and the third PMOS transistor T15 are turned off, the second NMOS transistor T14 and the third NMOS transistor T16 are turned on, the power supply voltage TVDD is outputted as the primary input voltage V11P, and the ground voltage GND is outputted as the secondary input voltage V11N.

In example embodiments, the input generator 110 may be implemented with a different structure from the structure of FIG. 2.

Figure 3:
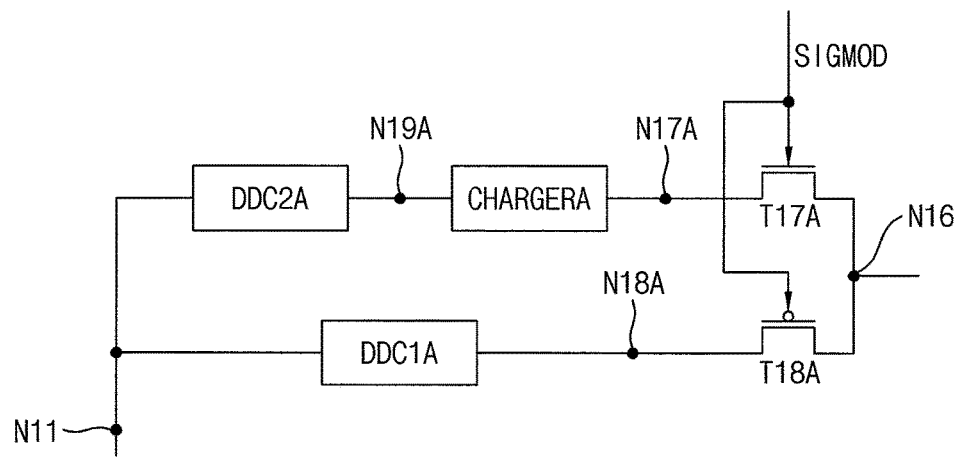
FIG. 3 is a block diagram illustrating an example of the mode voltage changer in the wireless power transceiver of FIG. 1 according to example embodiments.

FIG. 3 is a block diagram illustrating an example of the mode voltage changer in the wireless power transceiver of FIG. 1 according to example embodiments.

Referring to FIG. 3, a mode voltage changer 120A may include a first DC-DC converter DDC1A, a second DC-DC converter DDC2A, a PMOS transistor T18A, an NMOS transistor T17A and a charger CHARGERA.

The battery voltage VBAT of the battery 130 may be applied to a sixth node N16. A source of the fourth NMOS transistor T17A may be connected to a seventh node N17A, a gate of the fourth NMOS transistor T17A may receive the mode signal SIGMOD, and a drain of the fourth NMOS transistor T17A may be connected to the sixth node N16. A source of the fourth PMOS transistor T18A may be connected to a eighth node N18A, a gate of the fourth PMOS transistor T18A may receive the mode signal SIGMOD, and a drain of the fourth PMOS transistor T18A may be connected to the sixth node N16. A terminal of the charger CHARGERA may be connected to the seventh node N17A, and another terminal of the charger CHARGERA may be connected to a ninth node N19A. A terminal of the first DC-DC converter DDC1A may be connected to the first node N11, and another terminal of the first DC-DC converter DDC1A may be connected to the eighth node N18A. A terminal of the second DC-DC converter DDC2A may be connected to the first node N11A, and another terminal of the second DC-DC converter DDC2A may be connected to the ninth node N19A.

Figure 4:
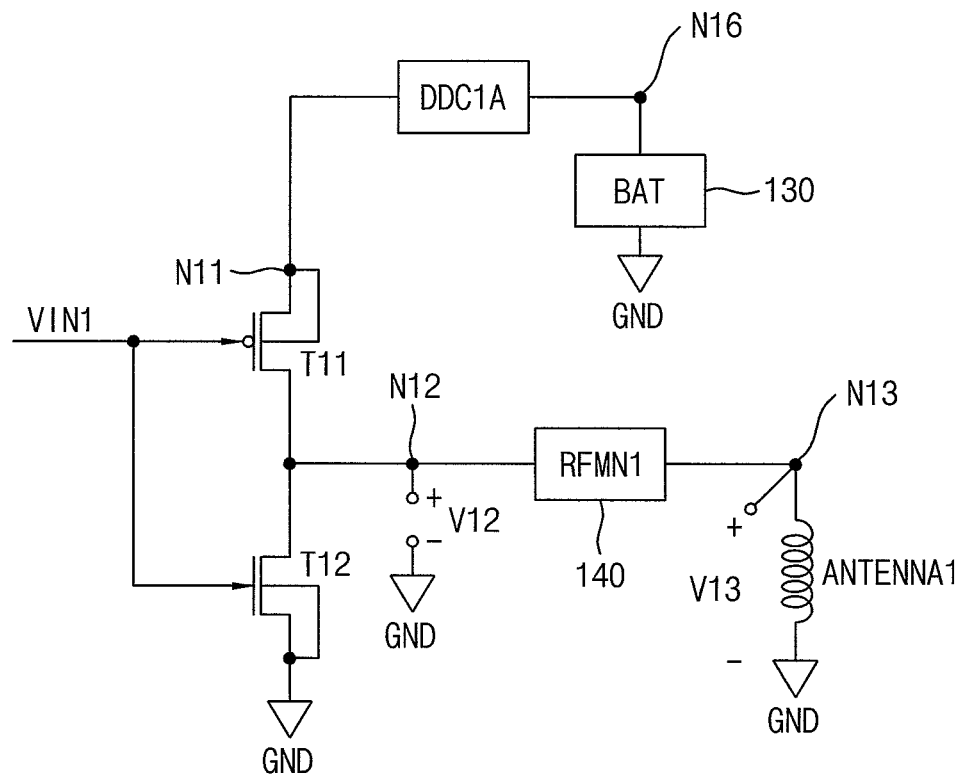
FIG. 4 illustrates an equivalent circuit of the wireless power transceiver of FIG. 1 in the power transmitting mode when the mode changer of FIG. 3 is employed in the wireless power transceiver of FIG. 1.

FIG. 4 illustrates an equivalent circuit of the wireless power transceiver of FIG. 1 in the power transmitting mode when the mode changer of FIG. 3 is employed in the wireless power transceiver of FIG. 1.

Referring to FIGS. 3 and 4, if the mode signal SIGMOD designates the power transmitting mode, the PMOS transistor T18A is turned on, the NMOS transistor T17A is turned off, the first DC-DC converter DDC1A may generate the power supply voltage TVDD at the first node N11 by converting the battery voltage VBAT of the battery 130 of the sixth node N16.

The first PMOS transistor T11 and the first NMOS transistor T12 operate as the class-D inverter using the power supply voltage TVDD and generate the voltage V12 of the second node N12 by inverting the input voltage VIN1 logically. The voltage V12 of the second node N12 is converted to the voltage V13 of the antenna ANTENNA1 through the impedance matching circuit 140. The antenna ANTENNA1 outputs a wireless power signal corresponding to the voltage V13 of the antenna ANTENNA1.

Figure 5:
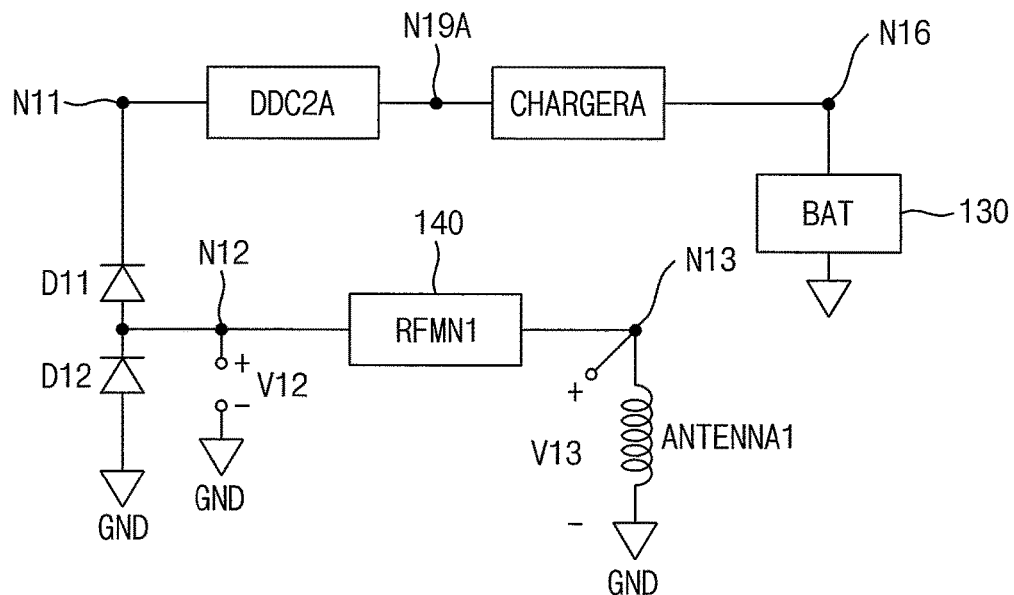
FIG. 5 illustrates an equivalent circuit of the wireless power transceiver of FIG. 1 in the power receiving mode when the mode changer of FIG. 3 is employed in the wireless power transceiver of FIG. 1.

FIG. 5 illustrates an equivalent circuit of the wireless power transceiver of FIG. 1 in the power receiving mode when the mode changer of FIG. 3 is employed in the wireless power transceiver of FIG. 1.

Referring to FIGS. 3 and 5, when the mode signal SIGMOD designates the power receiving mode, the PMOS transistor T11 may operate as the first diode D11 that is forward-biased between the second node N12 and the first node N11, and the NMOS transistor T12 may operate as a second diode D12 that is reverse-bias connected between the second node N12 and the ground voltage GND. The voltage V13 of the antenna ANTENNA1 corresponding to received signal through the antenna ANTENNA1 is converted to the voltage V12 of the second node N12 through the impedance matching circuit 140. The PMOS transistor T11 operates as the first diode D11 and outputs the rectified voltage of the voltage V12 of the second node N12 to the first node N11 as the power supply voltage TVDD. The PMOS transistor T18A may be turned off, the NMOS transistor T17A may be turned on, the second DC-DC converter DDC2A may generate a voltage of the ninth node N19 by converting the power supply voltage TVDD at the first node N11, and the charger CHARGERA may control a current flowing from the ninth node N19A to the sixth node N16A to be within available input current range of the battery 130 and may charge the battery 130 based on the voltage of the ninth node N19A.

Figure 6:
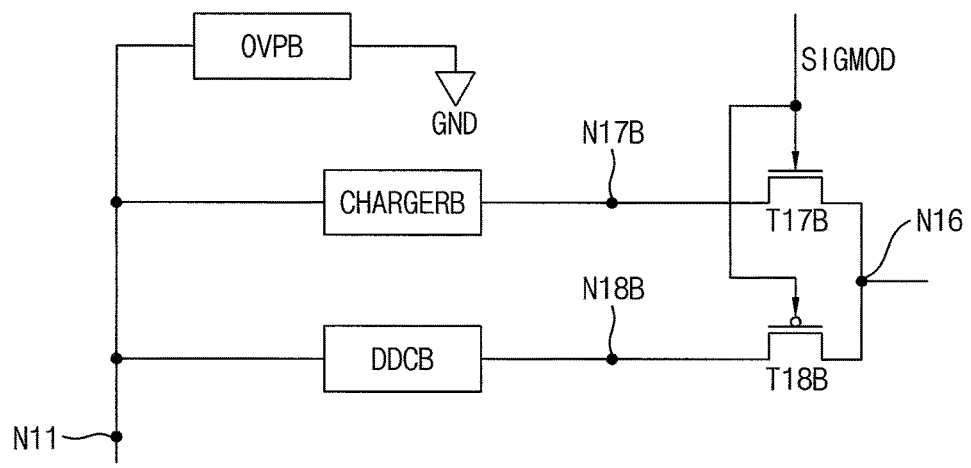
FIG. 6 is a block diagram illustrating another example of the mode changer in the wireless power transceiver of FIG. 1 according to example embodiments.

FIG. 6 is a block diagram illustrating another example of the mode voltage changer in the wireless power transceiver of FIG. 1 according to example embodiments.

Referring to FIG. 6, a mode voltage changer 120B may include a DC-DC converter DDCB, a charger CHARGERB, a PMOS transistor T18B, an NMOS transistor T17B, and an over-voltage protector (OVPB).

The battery voltage VBAT of the battery 130 may be applied to a sixth node N16. A source of the NMOS transistor T17B may be connected to a seventh node N17B, a gate of the NMOS transistor T17B may receive the mode signal SIGMOD, and a drain of the NMOS transistor T17B may be connected to the sixth node N16. A drain of the PMOS transistor T18B may be connected to an eighth node N18B, a gate of the PMOS transistor T18B may receive the mode signal SIGMOD, and a source of the PMOS transistor T18B may be connected to the sixth node N16. A terminal of the DC-DC converter DDCB may be connected to the first node N11, and another terminal of the DC-DC converter DDCB may be connected to the eighth node N18B. A terminal of the charger CHARGERB may be connected to the seventh node N17B, and another terminal of the charger CHARGERB may be connected to the first node N11. A terminal of the over-voltage protector OVPB may be connected to the first node N11, and another terminal of the over-voltage protector OVPB may be connected to the ground voltage GND.

In an example embodiment, the over-voltage protector OVPB may be implemented with a Zener diode.

Figure 7:
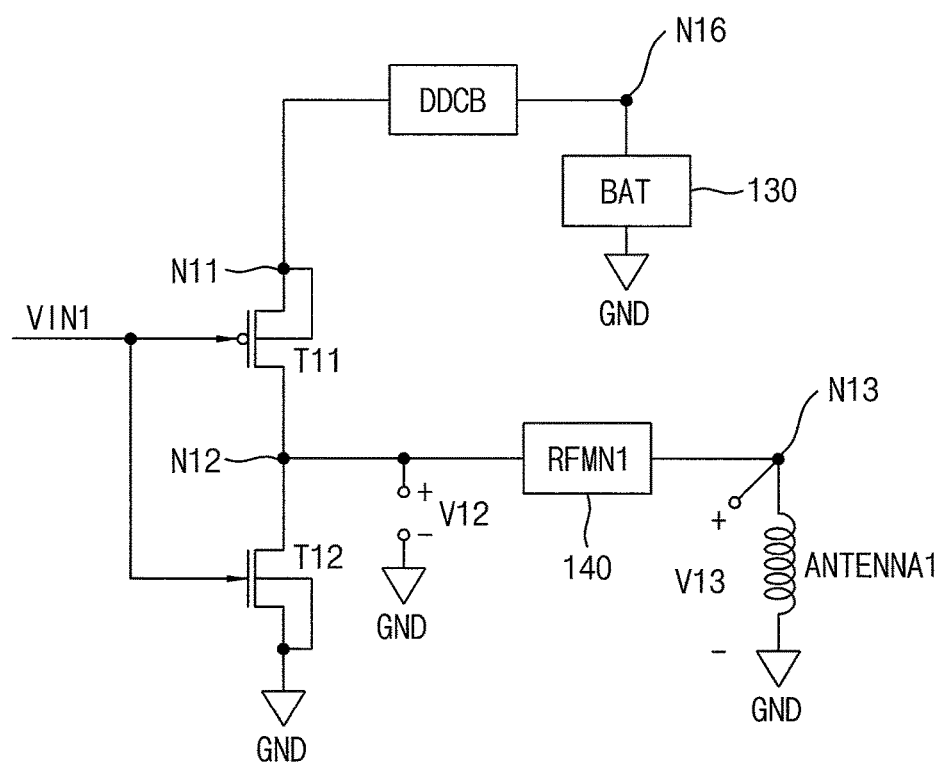
FIG. 7 illustrates an equivalent circuit of the wireless power transceiver of FIG. 1in the power transmitting mode when the mode changer of FIG. 6 is employed in the wireless power transceiver of FIG. 1.

FIG. 7 illustrates an equivalent circuit of the wireless power transceiver of FIG. 1 in the power transmitting mode when the mode changer of FIG. 6 is employed in the wireless power transceiver of FIG. 1.

Referring to FIGS. 6 and 7, when the mode signal SIGMOD designates the power transmitting mode, the PMOS transistor T18B may be turned on, the NMOS transistor T17B may be turned off, the DC-DC converter DDCB may generate the power supply voltage TVDD at the first node N11 by converting the battery voltage VBAT of the battery 130 at the sixth node N16.

The PMOS transistor T11 and the NMOS transistor T12 operate as the class-D inverter using the power supply voltage TVDD and generate the voltage V12 of the second node N12 by inverting the input voltage VIN1 logically. The voltage V12 of the second node N12 is converted to the voltage V13 at the antenna ANTENNA1 through the impedance matching circuit 140. The antenna ANTENNA1 outputs wireless power signal corresponding to the voltage V13 oat the antenna ANTENNA1.

Figure 8:
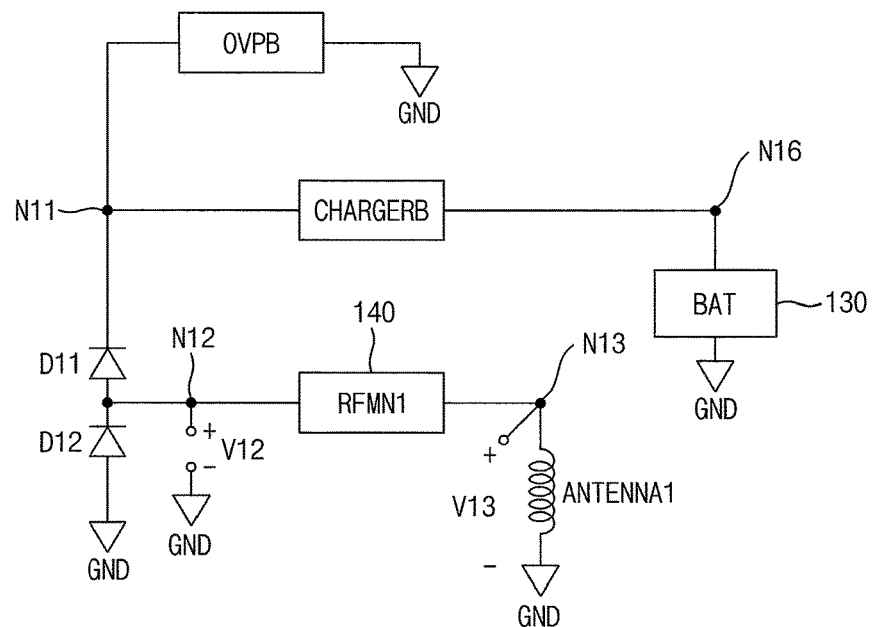
FIG. 8 illustrates an equivalent circuit of the wireless power transceiver of FIG. 1 in the power receiving mode when the mode changer of FIG. 6 is employed in the wireless power transceiver of FIG. 1.

FIG. 8 illustrates an equivalent circuit of the wireless power transceiver of FIG. 1 in the power receiving mode when the mode changer of FIG. 6 is employed in the wireless power transceiver of FIG. 1.

Referring to FIGS. 6 and 8, when the mode signal SIGMOD designates the power receiving mode, the PMOS transistor T11 may operate as the first diode D11 that is forward-bias connected between the second node N12 and the first node N11, and the NMOS transistor T12 may operate as a second diode D12 that is reverse-bias connected between the second node N12 and the ground voltage GND. The voltage V13 of the antenna ANTENNA1 corresponding to received signal through the antenna ANTENNA1 is converted to the voltage V12 of the second node N12 through the impedance matching circuit 140. The PMOS transistor T11 operates as the first diode D11 and outputs the rectified voltage of the voltage V12 of the second node N12 as the power supply voltage TVDD. The PMOS transistor T18B may be turned off, the NMOS transistor T17B may be turned on, the charger CHARGERB may control a current flowing from the first node N11 to the sixth node N16 to be within available input current range of the battery 130 and may charge the battery 130 based on the power supply voltage TVDD, and the over-voltage protector OVPB may maintain the power supply voltage TVDD of the first node N11 not to exceed a predetermined voltage level.

Figure 9:
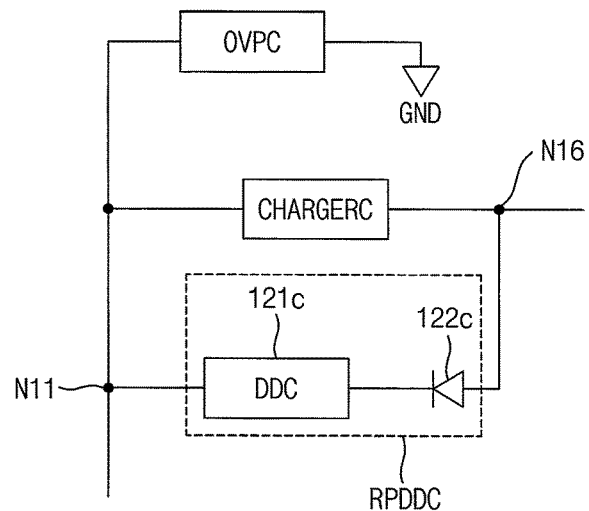
FIG. 9 is a block diagram illustrating still another example of the mode changer the wireless power transceiver of FIG. 1 according to example embodiments.

FIG. 9 is a block diagram illustrating still another example of the mode changer in the wireless power transceiver of FIG. 1 according to example embodiments.

Referring to FIG. 9, a mode voltage changer 120C may include a reverse-voltage preventing DC-DC converter RPDDC, a charger CHARGERC, and an over-voltage protector OVPC.

The battery voltage VBAT of the battery 130 may be applied to a sixth node N16. A terminal of the reverse-voltage preventing DC-DC converter RPDDC may be connected to the first node N11, and another terminal of the reverse-voltage preventing DC-DC converter RPDDC may be connected to the sixth node N16. A terminal of the charger CHARGERC may be connected to the sixth node N16, and another terminal of the charger CHARGERC may be connected to the first node N11. A terminal of the over-voltage protector OVPC may be connected to the first node N11, and another terminal of the over-voltage protector OVPC may receive the ground voltage GND.

In an embodiment, the reverse-voltage preventing DC-DC converter RPDDC may include a DC-DC converter DDC 121C and a diode 122C. A terminal of the DC-DC converter 121C may be connected to the first node N11, another terminal of the DC-DC converter 121C may be connected to an N terminal of the inner diode 122C, and a P terminal of the inner diode 122C may be connected to the sixth node N16.

In an embodiment, the reverse-voltage preventing DC-DC converter RPDDC may electrically disconnect the first node N11 from the sixth node N16 when the power supply voltage TVDD on the first node N11 is larger than the battery voltage VBAT of the battery 130 on the sixth node N16.

In an example embodiment, the over-voltage protector OVPB may be implemented with a Zener diode.

When a level of the power supply voltage TVDD is maintained to be below the level of predetermined voltage, the wireless power transceiver 100 may operate effectively in the power transmitting mode.

Figure 10:
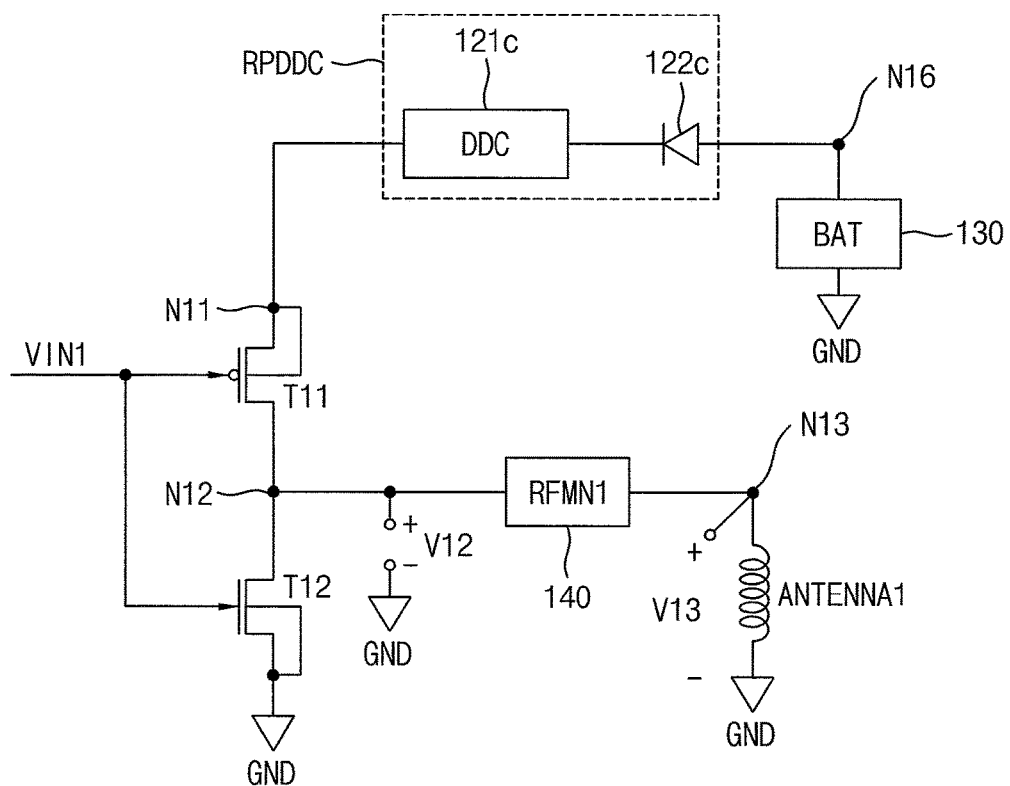
FIG. 10 illustrates an equivalent circuit of the wireless power transceiver of FIG. 1 in the power transmitting mode when the mode changer of FIG. 9 is employed in the wireless power transceiver of FIG. 1.

FIG. 10 illustrates an equivalent circuit of the wireless power transceiver of FIG. 1 in the power transmitting mode when the mode changer of FIG. 9 is employed in the wireless power transceiver of FIG. 1.

Referring to FIGS. 9 and 10, when the mode signal SIGMOD designates the power transmitting mode, the reverse-voltage preventing DC-DC converter RPDDC may generate the power supply voltage TVDD at the first node N11 by converting the battery voltage VBAT of the battery 130 at the sixth node N16.

The PMOS transistor T11 and the NMOS transistor T12 operate as the class-D inverter using the power supply voltage TVDD and generate the voltage V12 of the second node N12 by inverting the input voltage VIN1 logically. The voltage V12 of the second node N12 is converted to the voltage V13 at the antenna ANTENNA1 through the impedance matching circuit 140. The antenna ANTENNA1 outputs wireless power signal corresponding to the voltage V13 at the antenna ANTENNA1.

Figure 11:
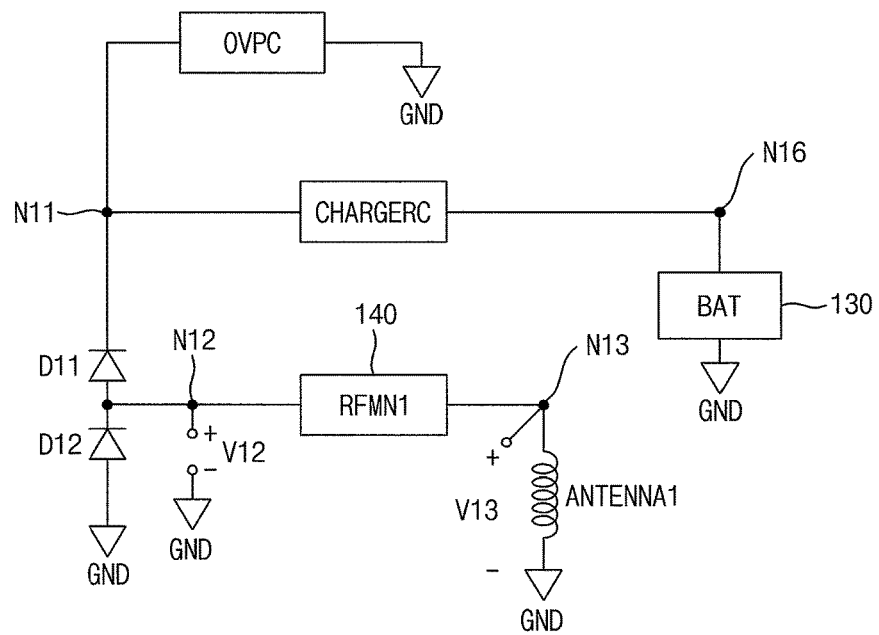
FIG. 11 illustrates an equivalent circuit of the wireless power transceiver of FIG. 1 in the power receiving mode when the mode changer of FIG. 9 is employed in the wireless power transceiver of FIG. 1.

FIG. 11 illustrates an equivalent circuit of the wireless power transceiver of FIG. 1 in the power receiving mode when the mode changer of FIG. 9 is employed in the wireless power transceiver of FIG. 1.

Referring to FIGS. 9 and 11, when the mode signal SIGMOD designates the power receiving mode, the PMOS transistor T11 may operate as the first diode D11 that is forward-bias connected between the second node N12 and the first node N11, and the NMOS transistor T12 may operate as a second diode D12 that is reverse-bias connected between the second node N12 and the ground voltage GND. The voltage V13 at the antenna ANTENNA1 corresponding to received signal through the antenna ANTENNA1 is converted to the voltage V12 of the second node N12 through the impedance matching circuit 140. The PMOS transistor T11 operates as the first diode D11 and outputs the rectified voltage of the voltage V12 of the second node N12 as the power supply voltage TVDD. The charger CHARGERC may control a current flowing from the first node N11 to the sixth node N16 to be within available input current range of the battery 130 and may charge the battery 130 based on the power supply voltage TVDD, and the over-voltage protector OVPC may maintain the power supply voltage TVDD of the first node N11 not to exceed a predetermined voltage level.

Figure 12:
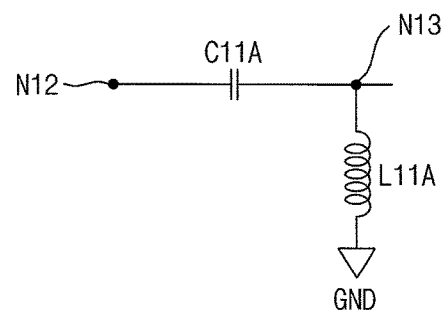
FIGS. 12 and 13 are circuit diagrams illustrating examples of the impedance matching circuit in the wireless power transceiver of FIG. 1 according to example embodiments.
Figure 13:
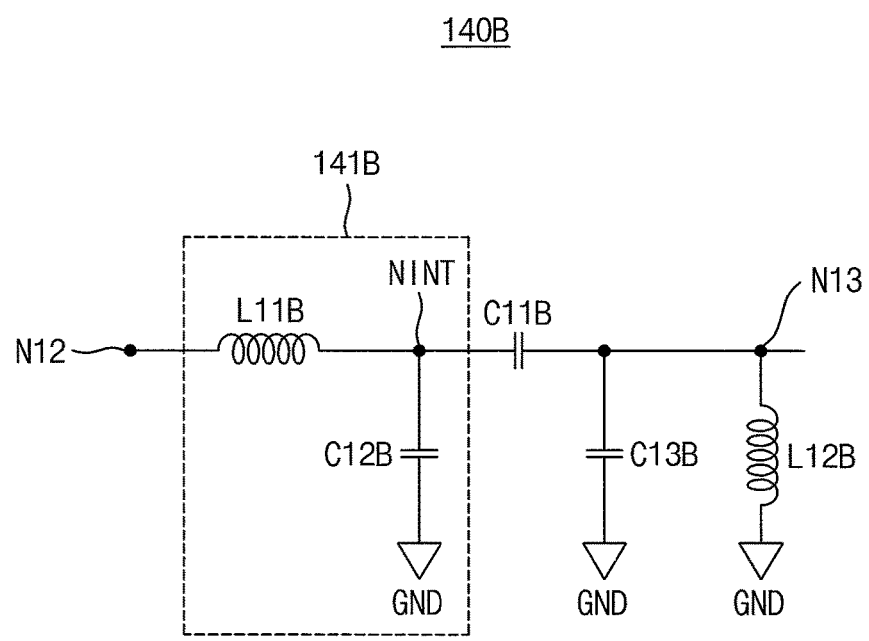

FIGS. 12 and 13 are circuit diagrams illustrating examples of the impedance matching circuit in the wireless power transceiver of FIG. 1 according to example embodiments.

Referring to FIG. 12, an impedance matching circuit 140A may include a capacitor C11A and an inductor L11A. A terminal of the capacitor C11A is connected to the second node N12 and another terminal of the capacitor C11A is connected to the sixth node N16. A terminal of the inductor L11A is connected to the sixth node N16 and another terminal of the inductor L11A is connected to the ground voltage GND. Capacitance of the capacitor C11A may be adjusted that a maximum power is delivered to the antenna ANTENNA1. The impedance matching circuit 140A of FIG. 12 may be employed when a quality (Q) factor of the antenna ANTENNA1 is relatively high.

Referring to FIG. 13, an impedance matching circuit 140B may include a first capacitor C11B, a second capacitor C12B, and a third capacitor C13B, a first inductor L11B, and a second inductor L12B. A terminal of the first inductor L11B is connected to the second node N12 and another terminal of the first inductor L11B is connected to an internal node NINT. A terminal of the second capacitor C12B is connected to the internal node NINT and another terminal of the second capacitor C12B is connected to the ground node GND. A terminal of the first capacitor C11B is connected to the internal node NINT and another terminal of the first capacitor C11B is connected to the sixth node N16. A terminal of the third capacitor C13B is connected to the sixth node N16 and another terminal of the third capacitor C13B receives the ground voltage GND. A terminal of the second inductor L12B is connected to the sixth node N16 and another terminal of the second inductor L12B is connected to the ground voltage GND.

Capacitance of the capacitors C11B, C12B, and C13B may be adjusted such that to a maximum power is delivered to the antenna ANTENNA1. The first inductor L11B and the second capacitor C12B may operate as a low-pass filter 141B. The low-pass filter 141B may increase quality of output wireless power signal of the antenna ANTENNA1 corresponding to the voltage V13 at the antenna ANTENNA1 by filtering high-frequency component of the voltage V12 of the second node N12 when Q factor of the antenna ANTENNA1 is relatively low.

Figure 14:
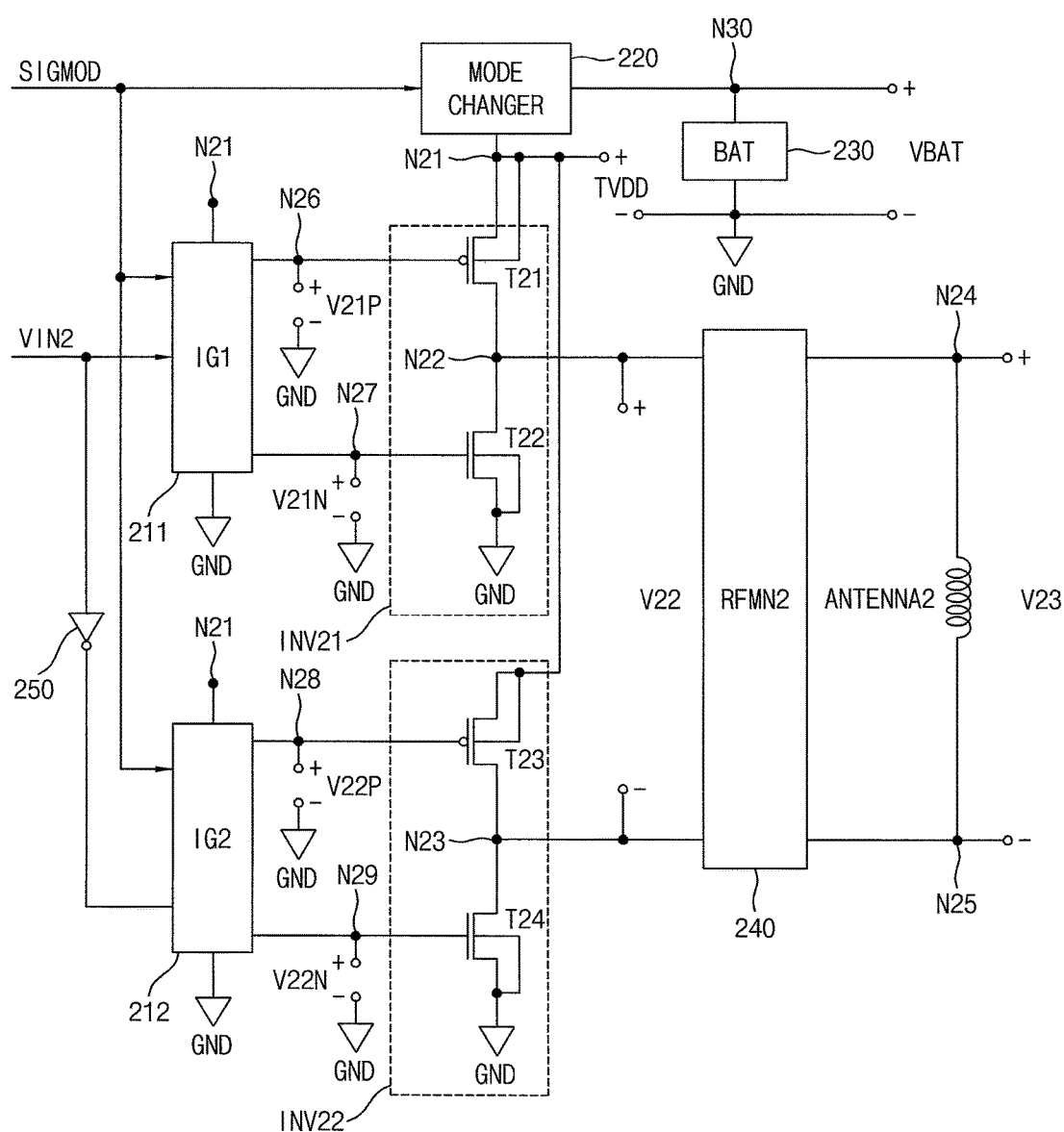
FIG. 14 is a block diagram illustrating a wireless power transceiver according to another example embodiment.

FIG. 14 is a block diagram illustrating a wireless power transceiver according to another example embodiment.

Referring to FIG. 14, a wireless power transceiver 200 includes a first input generator IG1 221, a second input generator IG2 222, a first inverter INV21, a second inverter INV22, a third inverter 250, a battery 230, an antenna ANTENNA2, an impedance matching circuit RFMN2, and a mode voltage changer 220. The first inverter INV21 may include a first PMOS transistor T21 and a first NMOS transistor T22, and the second inverter INV22 may include a second PMOS transistor T23 and a second NMOS transistor T24.

The first input generator 211 is connected to a first node N21 and a ground voltage GND. The first input generator 211 receives an input voltage VIN2 and a mode signal SIGMODE designating one of a power transmitting mode and a power receiving mode. The first input generator 211 outputs the input voltage VIN2 respectively as a first primary input voltage V21P and a first secondary input voltage V21N in the power transmitting mode. The mode signal SIGMOD may have a first logic level in the power transmitting mode. The first input generator 221 outputs a power supply voltage TVDD, which is a voltage of the first node N21, as the first primary input voltage V21P and outputs the ground voltage GND as the first secondary input voltage V21N in the power receiving mode. The mode signal SIGMOD may have a second logic level in the power receiving mode.

The third inverter 250 generates an inverted input voltage /VIN2, i.e., an inverted version of the input voltage VIN2 by inverting the input voltage VIN2 logically. The second input generator 212 is connected to the first node N21 and the ground voltage GND. The second input generator 212 receives the inverted input voltage /VIN2 and the mode signal SIGMOD. The second input generator 212 outputs the inverted input voltage /VIN2 respectively as a second primary input voltage V22P and a second secondary input voltage V22N in the power transmitting mode. The second input generator 212 outputs the power supply voltage TVDD as the second primary input voltage V22P and outputs the ground voltage GND as the second secondary input voltage V22N in the power receiving mode.

The first inverter INV21 inverts the input voltage VIN2 to output to a second node N22, the inverted input voltage /VIN2 in the power transmitting mode. The first inverter INV21 outputs to the first node N21, a first rectified voltage of a voltage of the second node N22 as the power supply voltage TVDD in the power receiving mode. The second inverter INV22 inverts the inverted input voltage /VIN to output to a third node N23, the input voltage VIN in the power transmitting mode. The second inverter INV22 outputs to the first node N21, a second rectified voltage of a voltage of the third node N23 as the power supply voltage TVDD in the power receiving mode.

The first PMOS transistor T21 may have a gate receiving the first primary input voltage V21P, a source and a body connected to the first node N21, a drain connected to the second node N22. The first PMOS transistor T21 may operate as a first diode and output, to the first node N21, the first rectified voltage of the voltage of the second node N22 as the power supply voltage TVDD in the power receiving mode. The first NMOS transistor T22 may include a gate receiving the first secondary input voltage V21N, a drain connected to the second node N22, and a source and a body connected to the ground voltage GND. The second PMOS transistor T23 may include a gate receiving the second primary input voltage V22P, a source and a body connected to the first node N21, a drain connected to the third node N23. The second PMOS transistor T23 may operate as a second diode and output, to the first node N21, the second rectified voltage of the voltage of the third node N23 as the power supply voltage TVDD in the power receiving mode. The second NMOS transistor T24 may include a gate receiving the second secondary input voltage V22N, a drain connected to the third node N23, and a source and a body connected to the ground voltage GND.

In the power transmitting mode, the first PMOS transistor T21 and the first NMOS transistor T22 operate as a first class-D inverter which generates the voltage of the second node N22 based on the input voltage VIN2, and the second PMOS transistor T23 and the second NMOS transistor T24 operate as a second class-D inverter which generates the voltage of the third node N23 based on the inverted input voltage /VIN2.

The impedance matching circuit 240 is connected between the second node N22, the third node N23 and the antenna ANTENNA2. The impedance matching circuit 240 may perform and impedance matching operation between the second node N22, the third node N23 and the antenna ANTENNA2 by converting a first voltage difference V22 between the second node N22 and the third node N23 to a second voltage difference V23 at the antenna ANTENNA2 or converting the second voltage difference V23 to the first voltage difference V22. The impedance matching circuit 240 may convert the first voltage difference V22 to the second voltage difference V23 such that a maximum power is delivered to the antenna ANTENNA2 in the power transmitting mode, and the impedance matching circuit 240 may convert the second voltage difference V23 to the first voltage difference V22 in the power receiving mode.

The mode voltage changer 220 converts a battery voltage VBAT of the battery 230 to output the power supply voltage TVDD in the power transmitting mode. The mode voltage changer 220 charges the battery 230 with a voltage converted from the power supply voltage TVDD in the power receiving mode.

Since the wireless power transceiver 200 of FIG. 14 differs from the wireless power transceiver 100 of FIG. 1 in that the wireless power transceiver 200 of FIG. 14 further includes the second input generator 212 and the second inverter INV22, the antenna ANTENNA2 in the wireless power transceiver 200 of FIG. 14 may generate an output wireless power signal whose intensity is two times higher than a density of an output wireless power signal generated by the antenna ANTENNA1 in the wireless power transceiver 100 of FIG. 1.

Structure and operation of the wireless power transceiver 200 of FIG. 13 may be understood based on the description with references to FIGS. 1 through 13.

Figure 15:
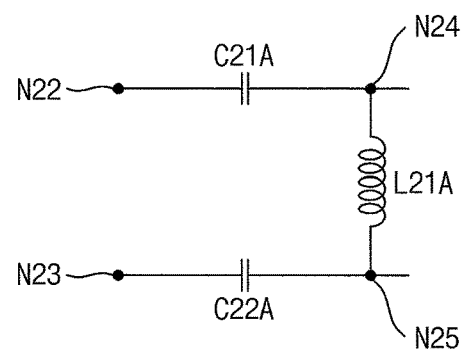
FIGS. 15 and 16 are circuit diagrams illustrating examples of the impedance matching circuit in the wireless power transceiver of FIG. 14 according to example embodiments.
Figure 16:
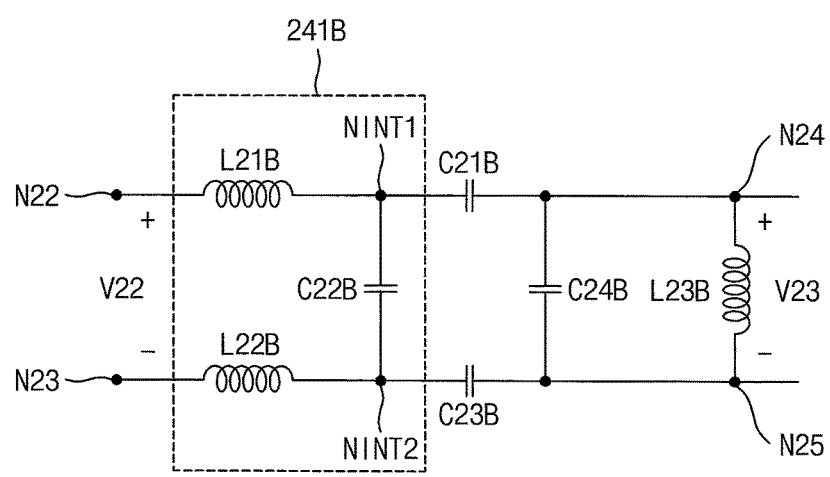

FIGS. 15 and 16 are circuit diagrams illustrating examples of the impedance matching circuit in the wireless power transceiver of FIG. 14 according to example embodiments.

Referring to FIG. 15, an impedance matching circuit 240A may include a first capacitor C21A, a second capacitor C22A, and an inductor L21A. A terminal of the first capacitor C21A is connected to the second node N22, and another terminal of the first capacitor C21A is connected to the fourth node N24. A terminal of the second capacitor C22A is connected to the third node N23, and another terminal of the second capacitor C22A is connected to the fifth node N25. A terminal of the inductor L21A is connected to the fourth node N24, and another terminal of the inductor L21A is connected to the fifth node N25. Capacitances of the capacitors C21A and C22A may be adjusted to deliver a maximum power to the antenna ANTENNA2. The impedance matching circuit 240A of FIG. 15 may be used when Q factor of the antenna ANTENNA2 is relatively high.

Referring to FIG. 16, an impedance matching circuit 240B may include a first capacitor C21B, a second capacitor C22B, a third capacitor C23B, a fourth capacitor C24B, a first inductor L21B, a second inductor L22B, and a third inductor L23B. A terminal of the first inductor L21B is connected to the second node N22, and another terminal of the first inductor L21B is connected to a first internal node NINT1. A terminal of the second inductor L22B is connected to the third node N23, and another terminal of the second inductor L22B is connected to a second internal node NINT2. A terminal of the second capacitor C22B is connected to the first internal node NINT1, and another terminal of the second capacitor C22B is connected to the second internal node NINT2. A terminal of the first capacitor C21B is connected to the first internal node NINT1, and another terminal of the first capacitor C21B is connected to the fourth node N24. A terminal of the third capacitor C23B is connected to the second internal node NINT2, and another terminal of the third capacitor C23B is connected to the fifth node N25. A terminal of the fourth capacitor C24B is connected to the fourth node N24, and another terminal of the fourth capacitor C24B is connected to the fifth node N25. A terminal of the third inductor L23B is connected to the fourth node N24, and another terminal of the third inductor L23B is connected to the fifth node N25.

Capacitance of the capacitors C21B, C22B, C23B, and C24B may be adjusted to deliver a maximum power to the antenna ANTENNA2.

The first and second inductors L21B and L22B and the second capacitor C22B may operate as a low-pass filter 241B. The low-pass filter 241B may increase quality of output wireless power signal of the antenna ANTENNA2 corresponding to the second voltage difference V23 by filtering a high-frequency component of the first voltage difference V22 when Q factor of the antenna ANTENNA2 is relatively low.

Figure 17:
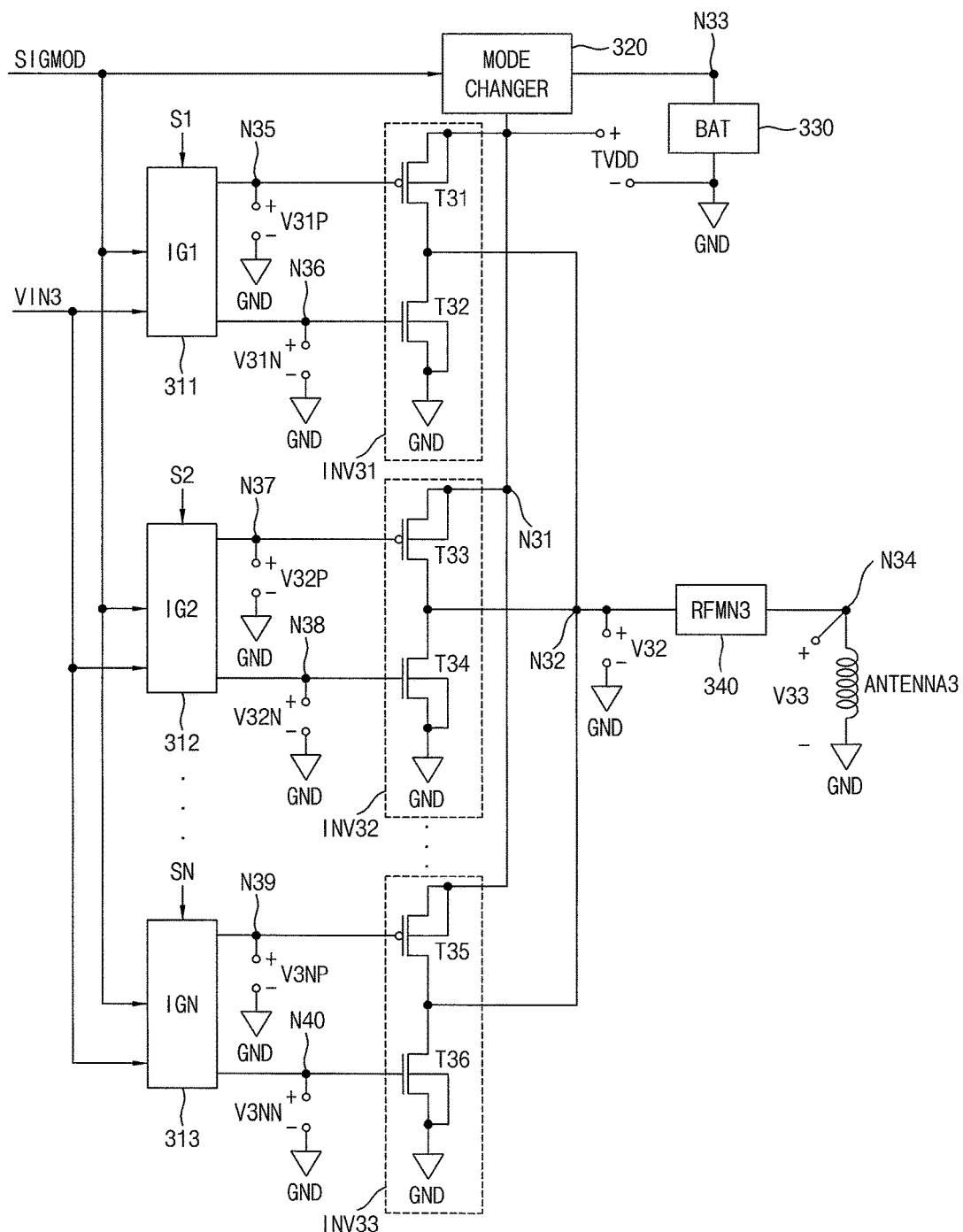
FIG. 17 is a block diagram illustrating a wireless power transceiver according to example embodiments.

FIG. 17 is a block diagram illustrating a wireless power transceiver according to example embodiments.

Referring to FIG. 17, the wireless power transceiver 300 includes first through (N)-th input generators 311, 312, and 313 (N is a natural number greater than two), first through (N)-th inverters INV31, INV32, and INV33, a battery 330, an antenna ANTENNA3, an impedance matching circuit 340, and a mode voltage changer 320. The first inverter INV3 includes a first PMOS transistor T31 and a first NMOS transistor T32. The second inverter INV32 includes a second PMOS transistor T33 and a second NMOS transistor T34. The (N)-th inverter INV33 includes a third PMOS transistor T35 and a third NMOS transistor T36.

The first input generator 311 is connected to a first node N31 and a ground voltage GND. The first input generator 311 receives an input voltage VIN3 and a mode signal SIGMODE designating one of a power transmitting mode and a power receiving mode. The first input generator 311 outputs the input voltage VIN3 respectively as a first primary input voltage V31P and a first secondary input voltage V31N in the power transmitting mode when a first amplitude shift keying (ASK) modulation signal S1 is activated. A mode signal SIGMOD has a first logic level in the power transmitting mode. The first input generator 311 renders the first primary input voltage V31P and the first secondary input voltage V31N in a floating state in the power transmitting mode when the first ASK modulation signal S1 is deactivated. The first input generator 311 outputs a power supply voltage TVDD, which is a voltage of the first node N31, as the first primary input voltage V31P and outputs the ground voltage GND as the first secondary input voltage V31N in the power receiving mode. The mode signal SIGMOD has s second logic level in the power receiving mode.

The second input generator 312 is connected to the first node N31 and the ground voltage GND. The second input generator 312 receives the input voltage VIN3 and the mode signal SIGMODE. The second input generator 312 outputs the input voltage VIN3 respectively as a second primary input voltage V32P and a second secondary input voltage V32N in the power transmitting mode when a second ASK modulation signal S2 is activated. The second input generator 312 renders the second primary input voltage V32P and the second secondary input voltage V32N in a floating state in the power transmitting mode when the second ASK modulation signal S2 is deactivated. The second input generator 312 outputs the power supply voltage TVDD as the second primary input voltage V32P and outputs the ground voltage GND as the second secondary input voltage V32N in the power receiving mode.

The (N)-th input generator 313 is connected to the first node N31 and the ground voltage GND. The (N)-th input generator 313 receives the input voltage VIN3 and the mode signal SIGMODE. The (N)-th input generator 313 outputs the input voltage VIN3 respectively as a (N)-th primary input voltage V3NP and a (N)-th secondary input voltage V3NN in the power transmitting mode when a (N)-th ASK modulation signal SN is activated. The (N)-th input generator 313 renders the (N)-th primary input voltage V3NP and the (N)-th secondary input voltage V3NN in a floating state in the power transmitting mode when the (N)-th ASK modulation signal SN is deactivated. The (N)-th input generator 313 outputs the power supply voltage TVDD as the (N)-th primary input voltage V3NP and outputs the ground voltage GND as the (N)-th secondary input voltage V3NN in the power receiving mode.

When the mode signal SIGMOD designates the power transmitting mode and the first ASK modulation signal S1 is activated, the first PMOS transistor T31 and the first NMOS transistor T32 outputs to the second node N32, an inverted version of the input voltage VIN3. When the mode signal SIGMOD designates the power transmitting mode and the first ASK modulation signal S1 is deactivated, the first PMOS transistor T31 and the first NMOS transistor T32 do not drive the second node N32. When the mode signal SIGMOD designates the power receiving mode, the first PMOS transistor T31 operates as a diode and outputs rectified voltage of the voltage V32 of the second node N32 as the power supply voltage TVDD of the first node N31.

When the mode signal SIGMOD designates the power transmitting mode and the second ASK modulation signal S2 is activated, the second PMOS transistor T33 and the second NMOS transistor T34 outputs to the second node N32, an inverted version of the input voltage VIN3. When the mode signal SIGMOD designates the power transmitting mode and the second ASK modulation signal S2 is deactivated, the second PMOS transistor T33 and the second NMOS transistor T34 do not drive the second node N32. When the mode signal SIGMOD designates the power receiving mode, the second PMOS transistor T33 operates as a diode and outputs a rectified voltage of the voltage V32 of the second node N32 as the power supply voltage TVDD of the first node N31.

When the mode signal SIGMOD designates the power transmitting mode and the (N)-th ASK modulation signal SN is activated, the (N)-th PMOS transistor T35 and the (N)-th NMOS transistor T36 outputs to the second node N32, an inverted version of the input voltage VIN3. When the mode signal SIGMOD designates the power transmitting mode and the (N)-th ASK modulation signal SN is deactivated, the (N)-th PMOS transistor T35 and the (N)-th NMOS transistor T36 do not drive the second node N32. When the mode signal SIGMOD designates the power receiving mode, the (N)-th PMOS transistor T35 operates as a diode and outputs a rectified voltage of the voltage V32 of the second node N32 as the power supply voltage TVDD of the first node N31.

In the power receiving mode, the first PMOS transistor T31 and the first NMOS transistor T32 operate as a first class-D inverter which generates the voltage V32 of the second node N32 based on the input voltage VIN3, the second PMOS transistor T33 and the second PMOS transistor T34 operate as a second class-D inverter which generates the voltage V32 of the second node N32 based on the input voltage VIN3, and the (N)-th PMOS transistor T35 and the (N)-th NMOS transistor T36 operate as a third class-D inverter which generates the voltage V32 of the second node N32 based on the input voltage VIN3.

Other components of the wireless power transceiver 300 may be understood based on the description with references to FIGS. 1 through 16.

Figure 18:
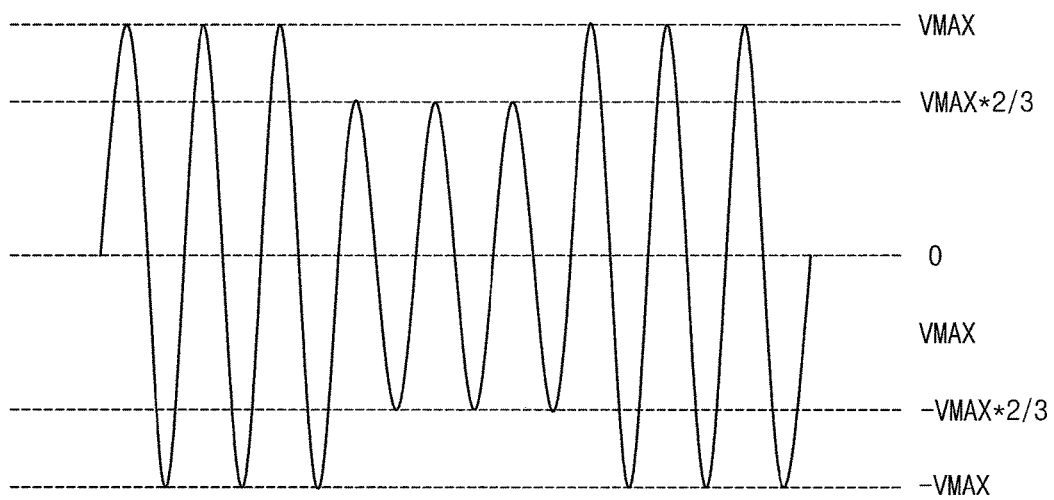
FIG. 18 is a graph illustrating the voltage induced in the antenna in the wireless power transceiver of FIG. 17.

FIG. 18 is a graph illustrating the voltage induced in the antenna in the wireless power transceiver of FIG. 17.

Referring to FIG. 18, it is noted that when the ASK modulation signals S1, S2, and SN are changed, an amplitude of the third voltage difference V33 at the antenna ANTENNA3 is also changed.

Figure 19:
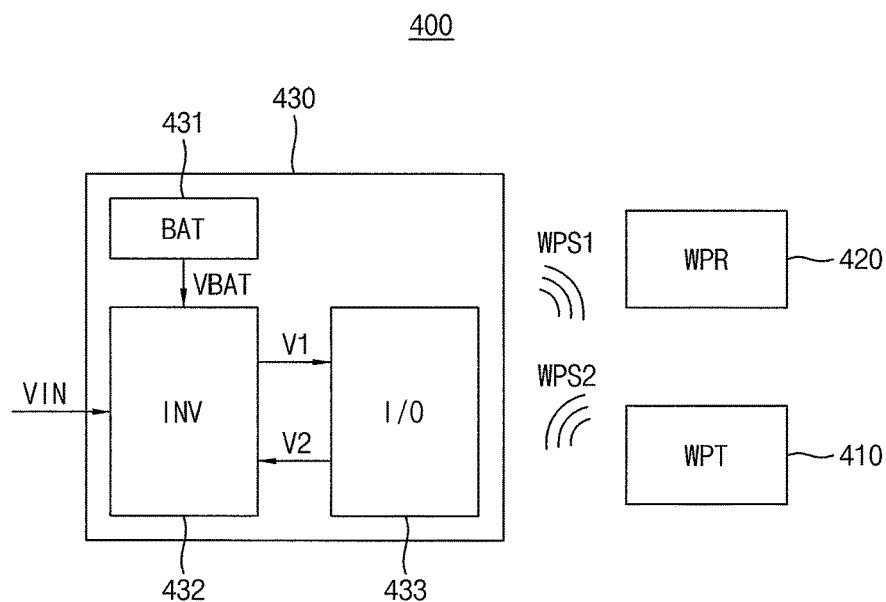
FIG. 19 is a block diagram illustrating a wireless power transceiving system according to example embodiments.

FIG. 19 is a block diagram illustrating a wireless power transceiving system according to example embodiments.

Referring to FIG. 19, a wireless power transceiving system 400 includes a wireless power transmitter 410, a wireless power receiver 420, and a wireless power transceiver 430. The wireless power transceiver 430 includes a battery 431, an inverter 432, and an input/output (I/O) circuit 433.

The inverter 432 generates a first voltage signal V1 corresponding to an input voltage VIN based on a battery voltage VBAT of the battery 431 in a power transmitting mode, and the inverter 432 charges the battery 431 with a rectified voltage of a second voltage signal V2 in a power receiving mode.

The I/O circuit 433 may generate a first wireless power signal WPS1 corresponding to the first voltage signal V1 and transmits the first wireless power signal WPS1 to the wireless power receiver 420 in the power transmitting mode, and the I/O circuit 433 generates the second voltage signal V2 corresponding to a second wireless power signal WPS2 received from the wireless power transmitter 410 in the power receiving mode.

In example embodiments, the wireless power transceiver 430 may further include an input generator and a mode voltage changer. The I/O unit 433 may include an impedance matching circuit and an antenna.

The input generator may output the input voltage VIN respectively as a primary input voltage and a secondary input voltage in the power transmitting mode, and the input generator may output a power supply voltage, which is a voltage of a first node, as the primary input voltage and output a ground voltage as the secondary input voltage in the power receiving mode. The inverter 432 may output to a second node, the first voltage signal V1 by inverting the input voltage VIN based on the power supply voltage in the power transmitting mode, and the inverter 432 may output to the first node, the rectified voltage of the second voltage signal V2, which is a voltage of the second node, as the power supply voltage in the power receiving mode. The impedance matching circuit may be connected between the second node and the antenna. The impedance matching circuit may convert the voltage of the second node to a voltage at the antenna or convert the voltage at the antenna to the voltage of the second node. The antenna may transmit the first wireless power signal WPS1 to the wireless power receiver 420 in the power transmitting mode, and receive the second wireless power signal WPS2 from the wireless power transmitter 410. The mode voltage changer may convert the battery voltage VBAT to the power supply voltage in the power transmitting mode, and may charge the battery 431 with a voltage converted from the power supply voltage in power receiving mode.

Components of the wireless power transceiving system 400 may be understood based on the description with references to FIGS. 1 through 18.

Figure 20:
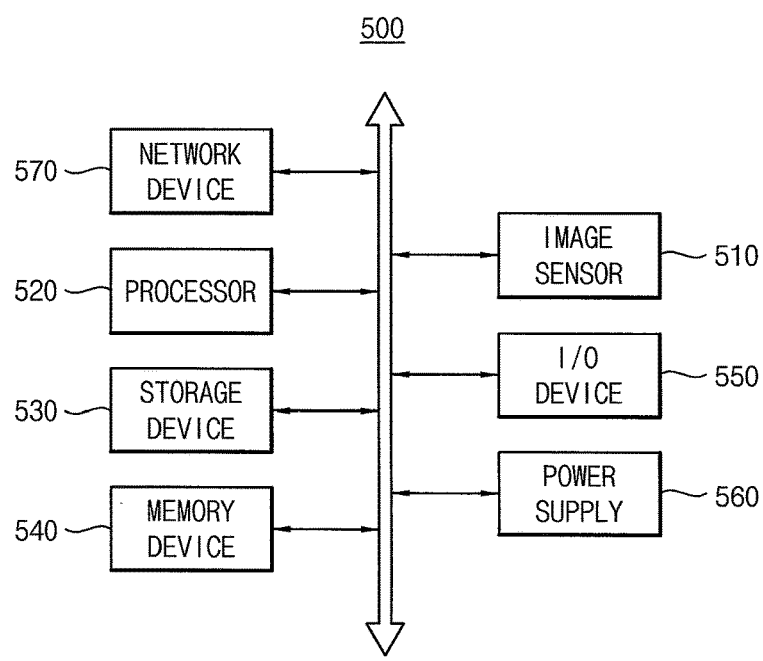
FIG. 20 is a block diagram illustrating a computing system according to example embodiments.

FIG. 20 is a block diagram illustrating a computing system according to example embodiments.

Referring to FIG. 20, a computing system 500 may include an image sensor 510, a processor 520, a storage device 530, a memory device 540, an input/output (I/O) device 550 and a power supply 560, and a network device 570.

The image sensor 510 may generate a digital signal corresponding to an incident light. The storage device 530 may store the digital signal. The processor 520 may control operations of the image sensor 510, the network device 570 and the storage device 530.

Although not illustrated in FIG. 20, the computing system 500 may further include ports that communicate with a video card, a sound card, a memory card, a universal serial bus (USB) device, or other electronic devices.

The processor 520 may perform various calculations or tasks. According to some embodiments, the processor 520 may be a microprocessor or a CPU. The processor 520 may communicate with the storage device 530, the memory device 540, and the network device 570, and the I/O device 550 via an address bus, a control bus, and/or a data bus. In some example embodiments, the processor 520 may be coupled to an extended bus, such as a peripheral component interconnection (PCI) bus.

The storage device 530 may include a non-volatile memory device such as a flash memory device, a solid state drive (SSD), a hard disk drive (HDD), a compact disk read-only memory (CD-ROM) drive, etc.

The memory device 540 may store data required for an operation of the electronic device 500. The memory device 540 may be a dynamic random access memory (DRAM), a static random access memory (SRAM), or a non-volatile memory, such as an erasable programmable read-only memory (EPROM), an electrically erasable programmable read-only memory (EEPROM), a flash memory, etc.

The I/O device 550 may include a keyboard, a mouse, a printer, a display device, etc. The power supply 560 may supply operational power. The power supply 560 may include a battery and a wireless power transceiver which charges the battery with a received wireless power from outside or transmits wireless power generated from the battery to outside. The wireless power transceiver may be implemented with one of the wireless power transceivers 100, 200, and 300 of FIGS. 1, 14, and 17.

The image sensor 510 may be connected to the processor 520 through one or more of the above buses or other communication links to communicate with the processor 520. The image sensor 510 may include a pixel array that detects incident light to generate an analog signal, and an analog-digital conversion unit that performs a sigma-delta analog-digital conversion and a cyclic analog-digital conversion with respect to the analog signal to generate a digital signal in a first operation mode and performs a single-slope analog-digital conversion with respect to the analog signal to generate the digital signal in a second operation mode.

The image sensor 510 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The network device 570 may transmit data of the processor 520, the image sensor 510, the storage device 530, the memory device 540, and the I/O device 550 to other computing system. The network device 570 may receive data from the other computing system.

According to example embodiments, the image sensor 510 may be integrated with the processor 520 in one chip, or the image sensor 510 and the processor 520 may be implemented as separate chips.

The computing system 500 may be any computing system using an image sensor. For example, the computing system 500 may include a digital camera, a mobile phone, a smart phone, a portable multimedia player (PMP), a personal digital assistant (PDA), etc.

Figure 21:
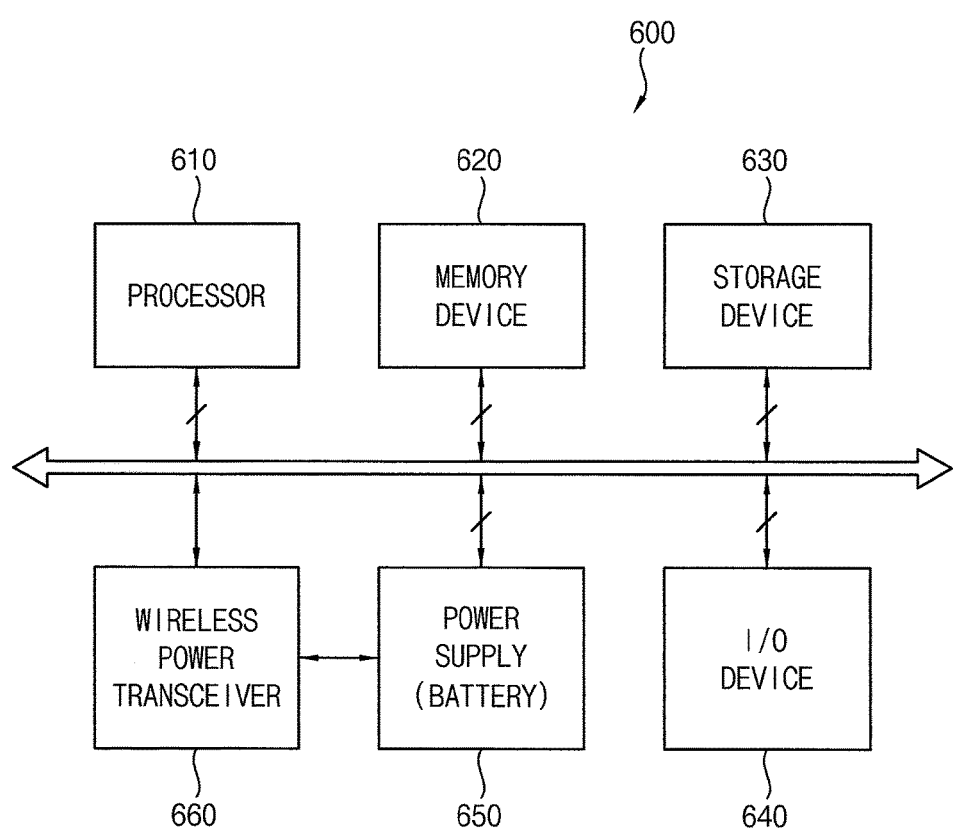
FIG. 21 is a block diagram illustrating a wearable device according to example embodiment.

FIG. 21 is a block diagram illustrating a wearable device according to example embodiments.

Figure 22:
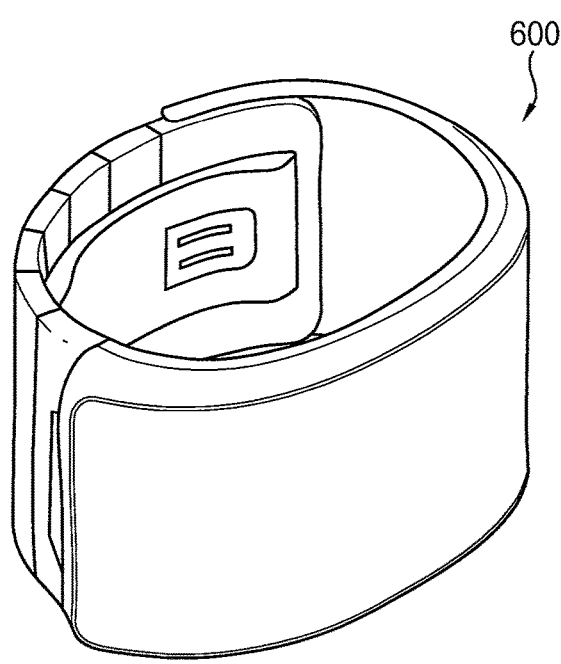
FIG. 22 is a diagram illustrating an example in which the wearable device of FIG. 21 is implemented with a smart watch.

FIG. 22 is a diagram illustrating an example in which the wearable device of FIG. 21 is implemented with a smart watch.

Referring to FIGS. 21 and 22, a wearable device 600 may include a processor 610, a memory device 620, a storage device 630, an input/output (I/O) device 640, a power supply 650, and a wireless power transceiver 660. In addition, the wearable device 600 may further include a plurality of ports for communicating a video card, a sound card, a memory card, a universal serial bus (USB) device, other electronic devices, etc. In an example embodiment, as illustrated in FIG. 22, the wearable device 600 may be implemented with a smart watch that a user wears on the wrist. However, the wearable device 600 is not limited thereto. For example, the wearable device 600 may be implemented as a headset, glasses, etc as well as the smart watch. That is, the wearable device 600 should be interpreted as a portable electronic device that the user can wear.

The processor 610 may perform various computing functions. The processor 610 may be a micro-processor, a central processing unit (CPU), an application processor (AP), etc. The processor 610 may be coupled to other components via an address bus, a control bus, a data bus, etc. In some example embodiments, the processor 610 may be coupled to an extended bus such as a peripheral component interconnection (PCI) bus.

The memory device 620 may store data for operations of the wearable device 600. The I/O device 640 may include an input device such as a keyboard, a keypad, a touchpad, a touch-screen, a mouse device, etc, and an output device such as a display device, a printer, a speaker, etc.

The power supply 650 may provide power for operations of the wearable device 600. Here, the power supply 650 may include a battery. The battery may be one of the batteries 130, 230, and 330 included in the wireless power transceivers 100, 200, and 300 of FIGS. 1, 14, and 17.

The wireless power transceiver 660 may be coupled to other components via the buses or other communication links. The wireless power transceiver 660 may charge the battery of the power supply 650 by receiving wireless power signal in a power receiving mode, and may transmit wireless power signal generated from the battery of the power supply 650 to external wireless power receiver in a power transmitting mode. The wireless power transceiver 660 may be implemented with one of the wireless power transceivers 100, 200, and 300 of FIGS. 1, 14, and 17. The wireless power transceiver 560 may be understood based on the description with references to FIGS. 1 through 19.

The present inventive concept may be applied to a portable electronic device employing a wireless charging technology. For example, the present inventive concept may be applied to a smart watch, a cellular phone, a smart phone, a smart pad, a tablet PC, a personal digital assistants (PDA), a portable multimedia player (PMP), a car navigation system, an MP3 player, a computer, a laptop, a digital camera, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A wireless power transceiver comprising:
   an input generator, connected to a first node and a ground voltage, configured to receive a mode signal indicating a power transmitting mode or a power receiving mode, configured to output an input voltage as a primary input voltage and a secondary input voltage in the power transmitting mode, and configured to output a power supply voltage of the first node as the primary input voltage and output the ground voltage as the secondary input voltage in the power receiving mode;
   an inverter configured to output to a second node, an inverted version of the input voltage in the power transmitting mode, and configured to output to the first node, a rectified voltage of a voltage of the second node in the power receiving mode;
a battery and an antenna;
an impedance matching circuit connected between the second node and the antenna; and
a mode voltage changer configured to convert a battery voltage of the battery to output the power supply voltage of the first node in the power transmitting mode, and configured to charge the battery with a voltage converted from the power supply voltage of the first node in the power receiving mode.

2. The wireless power transceiver of claim 1, wherein the inverter outputs the input voltage to the second node in the power transmitting mode, and a level of a voltage induced at the antenna is proportional to an intensity of a signal received at the antenna in the power receiving mode.

3. The wireless power transceiver of claim 1, wherein the inverter includes a p-channel metal-oxide semiconductor (PMOS) transistor and an n-channel metal-oxide semiconductor (NMOS) transistor,
wherein the PMOS transistor has a gate of the PMOS transistor receiving the primary input voltage, a drain of the PMOS transistor and a body of the PMOS transistor connected to the first node, and a source of the PMOS transistor connected to the second node, and the PMOS transistor operates as a first diode that outputs the rectified voltage as the power supply voltage of the first node in the power receiving mode,
wherein the NMOS transistor has a gate of the NMOS transistor receiving the secondary input voltage, a drain of the NMOS transistor connected to the second node, and a source of the NMOS transistor and a body of the NMOS transistor connected to the ground voltage, and
wherein the impedance matching circuit performs an impedance matching operation between the second node and the antenna such that a maximum power is delivered to the antenna in the power transmitting mode, and the impedance matching circuit converts the voltage induced at the antenna to the voltage of the second node in the power receiving mode.

4. The wireless power transceiver of claim 3, wherein, in the power receiving mode, the PMOS transistor operates as the first diode that is forward-biased between the second node and the first node, and the NMOS transistor operates as a second diode that is reverse-biased between the second node and the ground voltage.

5. The wireless power transceiver of claim 1, wherein the input generator includes first and second p-channel metal-oxide semiconductor (PMOS) transistors, and first and second n-channel metal-oxide semiconductor (NMOS) transistors,
wherein the first PMOS transistor has a source of the first PMOS transistor receiving the input voltage, a gate of the first PMOS transistor receiving the mode signal, and a drain of the first PMOS transistor connected to a third node, wherein the first NMOS transistor has a drain of the first NMOS transistor receiving the power supply voltage of the first node, a gate of the first NMOS transistor receiving the mode signal, and a source of the first NMOS transistor connected to the third node, and a voltage of the third node is the primary input voltage,
wherein the second PMOS transistor has a source of the second PMOS transistor receiving the input voltage, a gate of the second PMOS transistor receiving the mode signal, and a source of the second PMOS transistor connected to a fourth node, and wherein the second NMOS transistor has a drain of the second NMOS transistor connected to the ground voltage, a gate of the second NMOS transistor receiving the mode signal, and a source of the second NMOS transistor connected to the fourth node, and a voltage of the fourth node is the secondary input voltage.

6. The wireless power transceiver of claim 1, wherein the mode voltage changer includes a first DC-DC converter, a second DC-DC converter, a p-channel metal-oxide semiconductor (PMOS) transistor, an n-channel metal-oxide semiconductor (NMOS) transistor, and a charger,
wherein the battery voltage is applied to a third node,
wherein the NMOS transistor has a source of the NMOS transistor connected to the charger, a gate of the NMOS transistor receiving the mode signal, and a drain of the NMOS transistor connected to the third node, wherein the PMOS transistor has a source of the PMOS transistor connected to the first DC-DC converter, a gate of the PMOS transistor receiving the mode signal, and a drain of the PMOS transistor connected to the third node,
wherein the charger is connected between the second DC-DC converter and the NMOS transistor,
wherein the first DC-DC converter is connected between the first node and the PMOS transistor, and
wherein the second DC-DC converter is connected between the first node and the charger.

7. The wireless power transceiver of claim 6, wherein when the mode signal has a first logic level to designate the power transmitting mode, the first DC-DC converter generates the power supply voltage at the first node by converting the battery voltage of the third node, and
wherein when the mode signal has a second logic level to designate the power receiving mode, the second DC-DC converter generates a charging voltage by converting the power supply voltage of the first node, and the charger charges the battery based on the charging voltage.

8. The wireless power transceiver of claim 1, wherein the mode voltage changer includes a DC-DC converter, a charger, a p-channel metal-oxide semiconductor (PMOS) transistor, an n-channel metal-oxide semiconductor (NMOS) transistor, and an over-voltage protector,
wherein the battery voltage is applied to a third node,
wherein the NMOS transistor has a source of the NMOS transistor connected to a fourth node, a gate of the NMOS transistor receiving the mode signal, and a drain of the NMOS transistor connected to the third node, wherein the PMOS transistor has a drain of the PMOS transistor connected to a fifth node, a gate of the PMOS transistor receiving the mode signal, and a source of the PMOS transistor connected to the third node,
wherein the DC-DC converter is connected between the first node and the fifth node,
wherein the charger is connected between the first node and the fourth node, and
wherein the over-voltage protector is connected between the first node and the ground voltage.

9. The wireless power transceiver of claim 8, wherein when the mode signal has a first logic level to designate the power transmitting mode, the DC-DC converter generates the power supply voltage at the first node by converting the battery voltage of the fifth node, and
wherein when the mode signal has a second logic level to designate the power receiving mode, the charger charges the battery based on the power supply voltage of the first node, and the over-voltage protector maintains the power supply voltage of the first node so as not to exceed a predetermined voltage level.

10. The wireless power transceiver of claim 1, wherein the mode changer includes a reverse-voltage preventing DC-DC converter, a charger, and an over-voltage protector,
wherein the battery voltage is applied to a third node,
wherein the reverse-voltage preventing DC-DC converter is connected between the first node and the third node,
wherein the charger is connected in parallel with the reverse-voltage preventing DC-DC converter between the first node and the third node, and
wherein the over-voltage protector is connected between the first node and the ground voltage.

11. The wireless power transceiver of claim 10, wherein when the mode signal has a first logic level to designate the power transmitting mode, the reverse-voltage preventing DC-DC converter generates the power supply voltage at the first node by converting the battery voltage of the third node, and
wherein when the mode signal has a second logic level to designate the power receiving mode, the charger charges the battery based on the power supply voltage of the first node, and the over-voltage protector maintains the power supply voltage of the first node so as not to exceed a predetermined voltage level.

12. The wireless power transceiver of claim 11, wherein the power supply voltage of the first node is maintained to be lower than the predetermined voltage level in the power transmitting mode.

13. The wireless power transceiver of claim 10, wherein the reverse-voltage preventing DC-DC converter electrically disconnects the first node and the third node when the power supply voltage of the first node is larger than the battery voltage of the third node.

14. The wireless power transceiver of claim 10, wherein the reverse-voltage preventing DC-DC converter includes a DC-DC converter and a diode,
wherein the DC-DC converter is connected between the first node and the diode, and the diode is connected between the DC-DC converter and the third node.

15. The wireless power transceiver of claim 1, wherein the impedance matching circuit generates the voltage of the antenna by filtering a frequency component of the voltage of the second node, the frequency component has a higher frequency than a unfiltered frequency component.

16. The wireless power transceiver of claim 1, wherein when the input voltage has a frequency of 13.65 MHz, the wireless power transceiver operates as a near field communication (NFC) transceiver.

* * * * *